US007914603B2

(12) United States Patent
Shajii et al.

(10) Patent No.: US 7,914,603 B2
(45) Date of Patent: Mar. 29, 2011

(54) PARTICLE TRAP FOR A PLASMA SOURCE

(75) Inventors: Ali Shajii, Canton, MA (US); Xing Chen, Lexington, MA (US); Andrew Cowe, Andover, MA (US); David Burtner, Belmont, MA (US); William Robert Entley, Wakefield, MA (US); ShouQian Shao, Boston, MA (US)

(73) Assignee: MKS Instruments, Inc., Andover, MA (US)

( * ) Notice: Subject to any disclaimer, the term of this patent is extended or adjusted under 35 U.S.C. 154(b) by 263 days.

(21) Appl. No.: 12/147,078

(22) Filed: Jun. 26, 2008

(65) Prior Publication Data

US 2009/0320677 A1 Dec. 31, 2009

(51) Int. Cl.
B01D 46/46 (2006.01)

(52) U.S. Cl. ............... 95/17; 55/288; 55/434; 55/434.3; 55/462; 55/DIG. 15; 55/385.1; 95/267; 95/25; 95/272; 96/221; 118/723 R; 118/723 ER; 204/298.07

(58) Field of Classification Search ............ 55/288, 55/434, 434.3, 434.4, 462, DIG. 15, 385.1, 55/465, 385.2; 95/267, 17, 25, 272, 67, 70, 95/73, 78; 96/55, 60, 62, 74, 221
See application file for complete search history.

(56) References Cited

U.S. PATENT DOCUMENTS

| | | | |
|---|---|---|---|
| 3,892,550 A * | 7/1975 | Riis ........................... 55/434.2 |
| 4,776,923 A | 10/1988 | Spencer et al. ............ 156/643 |
| 5,149,339 A * | 9/1992 | Collins, Jr. .................... 95/70 |
| 5,484,575 A * | 1/1996 | Steenackers .................. 422/176 |
| 5,614,026 A | 3/1997 | Williams ............... 118/723 ME |
| 5,711,147 A * | 1/1998 | Vogtlin et al. .................. 60/274 |
| 5,749,937 A * | 5/1998 | Detering et al. ............. 75/10.19 |
| 6,027,619 A | 2/2000 | Cathey et al. ............ 204/192.38 |
| 6,045,618 A * | 4/2000 | Raoux et al. ................. 118/715 |
| 6,090,175 A * | 7/2000 | Richard ........................ 55/337 |
| 6,193,802 B1* | 2/2001 | Pang et al. .................... 118/715 |
| 6,206,970 B1* | 3/2001 | Atwell .......................... 118/715 |
| 6,241,793 B1* | 6/2001 | Lee et al. ..................... 55/434.2 |
| 6,319,369 B1 | 11/2001 | Flynn et al. ............. 204/192.38 |
| 6,499,425 B1 | 12/2002 | Sandhu et al. ................ 118/723 |
| 6,793,733 B2 | 9/2004 | Janakiraman et al. ........ 118/715 |
| 6,872,909 B2 | 3/2005 | Holber et al. ............ 219/121.52 |
| 7,097,682 B2* | 8/2006 | Tanaka et al. ................ 55/385.4 |
| 7,569,094 B2* | 8/2009 | Kane et al. ........................ 95/28 |
| 2003/0150198 A1* | 8/2003 | Illingworth et al. ............. 55/406 |
| 2004/0079287 A1* | 4/2004 | Smith et al. ................... 118/715 |
| 2004/0238125 A1* | 12/2004 | Ono et al. ................. 156/345.46 |
| 2008/0017318 A1 | 1/2008 | Kobayashi et al. ...... 156/345.43 |

* cited by examiner

FOREIGN PATENT DOCUMENTS

EP 0 289 858 11/1988

Primary Examiner — Jason M Greene
Assistant Examiner — Dung Bui
(74) Attorney, Agent, or Firm — Proskauer Rose LLP

(57) ABSTRACT

A particle trap for a remote plasma source includes a body structure having an inlet for coupling to a chamber of a remote plasma source and an outlet for coupling to a process chamber inlet. The particle trap for a remote plasma source also includes a gas channel formed in the body structure and in fluid communication with the body structure inlet and the body structure outlet. The gas channel can define a path through the body structure that causes particles in a gas passing from a first portion of the channel to strike a wall that defines a second portion of the gas channel at an angle relative to a surface of the wall. A coolant member can be in thermal communication with the gas channel.

56 Claims, 12 Drawing Sheets

PARTICLE TRAP FOR A PLASMA SOURCE

FIELD OF THE INVENTION

The invention relates generally to plasma generation and processing equipment. In particular, the invention relates to methods and apparatus for removing contaminant particles from an activated gas.

BACKGROUND

Plasmas are often used to activate gases placing them in an activated state such that the gases have an enhanced chemical reactivity. In some cases, the gases are activated to produce dissociated gases containing ions, free radicals, atoms and molecules. Dissociated gases are used for numerous industrial and scientific applications including processing solid materials such as semiconductor wafers, powders, and other gases. Properties of activated gases and conditions under which materials are exposed to the gases vary widely depending on the application. Significant amounts of power are sometimes required in the plasma for dissociation to occur.

Plasma sources generate plasmas by, for example, applying an electric potential of sufficient magnitude to a plasma gas (e.g., $O_2N_2$, Ar, $NF_3$, $H_2$ and He), or a mixture of gases, to ionize at least a portion of the gas. Plasmas can be generated in various ways, including DC discharge, radio frequency (RF) discharge, and microwave discharge. DC discharge plasmas are achieved by applying a potential between two electrodes in a plasma gas. RF discharge plasmas are achieved either by capacitively or inductively coupling energy from a power supply into a plasma. Microwave discharge plasmas are achieved by directly coupling microwave energy through a microwave-passing window into a discharge chamber containing a plasma gas. Plasmas are typically contained within chambers that are composed of metallic materials such as aluminum or stainless steel or dielectric materials such as quartz, sapphire, yttrium oxide, zirconium oxide, and/or aluminum nitride.

A known problem in the art of plasma generation is that particles are often generated which can, for example, contaminate the plasma generator or chambers coupled to an output of the plasma chamber. A need therefore exists for decreasing the number of contaminant particles in activated gases generated by plasma generation equipment.

SUMMARY OF THE INVENTION

The invention generally features apparatus and methods that can provide reduced particle counts in an activated gas. One advantage is that the invention minimizes the introduction of particles or defects on the material (e.g., a semiconductor wafer) to be processed. Another advantage is that the invention provides a higher yield rate in the manufacturing of materials to be processed (e.g., a semiconductor wafer). Yet another advantage is that the invention provides an apparatus that can be replaceable to minimize manufacturing downtime. Another advantage is that the invention reduces particle count while minimizing recombination of the activated gas.

The invention, in one aspect, features a particle trap for a remote plasma source. The particle trap includes a body structure having an inlet for coupling to a chamber of a remote plasma source and an outlet for coupling to a process chamber inlet. The particle trap also includes a gas channel formed in the body structure and in fluid communication with the body structure inlet and the body structure outlet, the gas channel defining a path through the body structure that causes particles in a gas passing from a first portion of the channel to strike a wall that defines a second portion of the gas channel at an angle relative to a surface of the wall.

In some embodiments, the wall is a portion of an obstruction that is interior to exterior walls of the body structure. In some embodiments, the particle trap includes a plurality of obstructions. In some embodiments, the obstruction includes a cooling member in thermal communication with the surface of the wall of the obstruction. The cooling member can include a coolant channel to receive a fluid to cool the surface of the wall of the obstruction.

In some embodiments, the angle is between 45-135 degrees. In some embodiments, the first portion of the channel is at a substantially normal angle to the second portion of the channel. The gas channel can have a third portion and particles in the gas passing from the second portion strike a second wall that defines the third portion at a second angle relative to a second surface of the second wall. In some embodiments, the second angle is between approximately 45-135 degrees. In some embodiments, the first section and the second section define a curve. The surface of the wall can be at least one of irregular or textured. In some embodiments, the body structure is disposed in the remote plasma source. In some embodiments, a pressure drop between the body structure inlet and the body structure outlet is less than approximately 100 milliTor. In some embodiments, the particle trap includes a depression in the wall of at least one of the first portion or the second portion of the gas channel, the depression adapted to collect the particles in the gas.

In some embodiments, the particle trap includes a cooling member in thermal communication with the gas channel. The cooling member can include at least one coolant channel formed in the body structure to receive a fluid to cool at least a portion of the wall of the second portion of the gas channel. In some embodiments, the cooling member includes a cooling plate. In some embodiments, the cooling member indirectly cools at least a portion of the wall of the second portion of the gas channel. The cooling member can be disposed in the body structure. In some embodiments, a path of the at least one coolant channel is at least substantially parallel to the path of the gas channel.

The invention, in another aspect, features a particle trap for a remote plasma source. The particle trap includes a body structure having an inlet for coupling to a chamber of a remote plasma source and an outlet for coupling to a process chamber inlet. The particle trap also includes a gas channel formed in the body structure and in fluid communication with the body structure inlet and the body structure outlet, the gas channel defining a path through the body structure. The particle trap also includes a cooling member in thermal communication with the gas channel.

In some embodiments, the cooling member includes at least one coolant channel formed in the body structure to receive a fluid to cool at least a portion of a wall of the gas channel. In some embodiments, the cooling member includes a cooling plate. The cooling member can indirectly cool at least a portion of a wall of the gas channel. The cooling member can be disposed in the body structure.

In some embodiments, the path through the body structure causes particles in a gas passing from a first portion of the channel to strike a wall that defines a second portion of the gas channel at an angle relative to a surface of the wall. In some embodiments, the gas channel has a third portion and particles in the gas passing from the second portion strike a second wall that defines the third portion at a second angle relative to a second surface of the second wall. The body structure can be disposed in the remote plasma source. In some embodiments, the particle trap includes a depression in the wall of at least one of the first portion or the second portion of the gas channel, the depression adapted to collect the particles in the gas.

The invention, in another aspect, features a method for removing particles from a gas output by a plasma source. The method involves receiving at an inlet an activated gas generated by a plasma in a chamber. The method also involves directing the activated gas through a gas channel formed in a body structure configured to cause particles in the activated gas passing from a first portion of the gas channel to strike a wall that defines a second portion of the gas channel at an angle relative to a surface of the wall. The method also involves directing the activated gas exiting the gas channel to a process chamber.

The method can involve cooling at least a portion of the wall to cause particles in the activated gas to accumulate on the wall. In some embodiments, the method involves directing the activated gas through the gas channel of the body structure from the second portion of the channel to strike a second wall that defines a third portion of the channel at a second angle relative to a second surface of the second wall. The method can involve cooling at least a portion of the second wall to cause the particles in the activated gas to accumulate on the second wall. The method can involve flowing a fluid in a coolant channel in the body structure to cool at least a portion of the wall. In some embodiments, the wall is indirectly cooled. The method can involve regulating a temperature of the wall. In some embodiments, the method involves generating a signal when the particle count exceeds a predetermined limit. In some embodiments, the gas channel causes a pressure drop between an inlet of the body structure and an outlet of the body structure less than approximately 100 milliTor.

The invention, in another aspect, features a method for removing particles from a gas output by a plasma source. The method involves receiving at an inlet an activated gas generated by a plasma in a chamber. The method also involves directing the activated gas through a gas channel formed in a body structure. The method also involves cooling at least a portion of a wall of the gas channel to cause particles in the activated gas to accumulate on the wall.

In some embodiments, at least a portion of the wall is indirectly cooled. In some embodiments, the method involves regulating a temperature of the wall. In some embodiments, the method involves directing the activated gas through the gas channel of the body structure from a first portion of the channel to strike a second wall that defines a second portion of the channel at an angle relative to a surface of the wall. The method can involve cooling at least a portion of the second wall to cause the particles in the activated gas to accumulate on the second wall. In some embodiments, the method involves flowing a fluid in a coolant channel in the body structure to cool at least a portion of the wall.

The invention, in another aspect, features a system. The system includes a remote plasma source. The system also includes a body structure having an inlet for coupling to a chamber of a remote plasma source and an outlet for coupling to an inlet of a process chamber. The system also includes a gas channel formed in the body structure and in fluid communication with the body structure inlet and the body structure outlet, the gas channel defining a path through the body structure that causes particles in a gas passing from a first portion of the channel to strike a wall that defines a second portion of the gas channel at an angle relative to a surface of the wall.

The invention, in another aspect, features a method of manufacturing a particle trap. The method involves creating a gas channel in a body structure, the gas channel having an inlet capable of coupling to a chamber of a remote plasma source and an outlet capable of coupling to an inlet of a process chamber, the gas channel being configured to cause particles in a gas passing from a first portion of the channel to strike a wall that defines a second portion of the gas channel at an angle relative to a surface of the wall.

In some embodiments, the method involves thermally coupling a cooling member to the gas channel. In some embodiments, the method involves forming at least one coolant channel in the body structure to receive a fluid to cool at least a portion of the wall of the second portion of the gas channel.

The invention, in another aspect, features a particle trap for a remote plasma source. The particle trap includes a means for receiving at an inlet an activated gas generated by a plasma in a chamber. The particle trap also includes a means for directing the activated gas through a gas channel formed in a body structure configured to cause particles in the activated gas passing from a first portion of the gas channel to strike a wall that defines a second portion of the gas channel at an angle relative to a surface of the wall. The particle trap also includes a means for cooling at least a portion of the wall to cause particles in the activated gas to accumulate on the wall.

The invention, in another aspect, features a particle trap for a remote plasma source. The particle trap includes a body structure having an inlet for coupling to a chamber of a remote plasma source and an outlet for coupling to a process chamber inlet. The particle trap also includes at least one obstruction in the body structure. The at least one obstruction is configured to deflect a gas flowing from the inlet to the outlet to cause particles in the gas to strike a surface of the obstruction. In some embodiments, the at least one obstruction is a plurality of obstructions. In some embodiments, the at least one obstruction includes a cooling member in thermal communication with the surface of the at least one obstruction. The cooling member can include a coolant channel to receive a fluid to cool the surface of the at least one obstruction. In some embodiments, the at least one obstruction is a wall that is interior to exterior walls of the body structure.

BRIEF DESCRIPTION OF THE DRAWINGS

The foregoing and other objects, features and advantages of the invention, as well as the invention itself, will be more fully understood from the following illustrative description, when read together with the accompanying drawings, which are not necessarily to scale.

DETAILED DESCRIPTION

Figure 1:
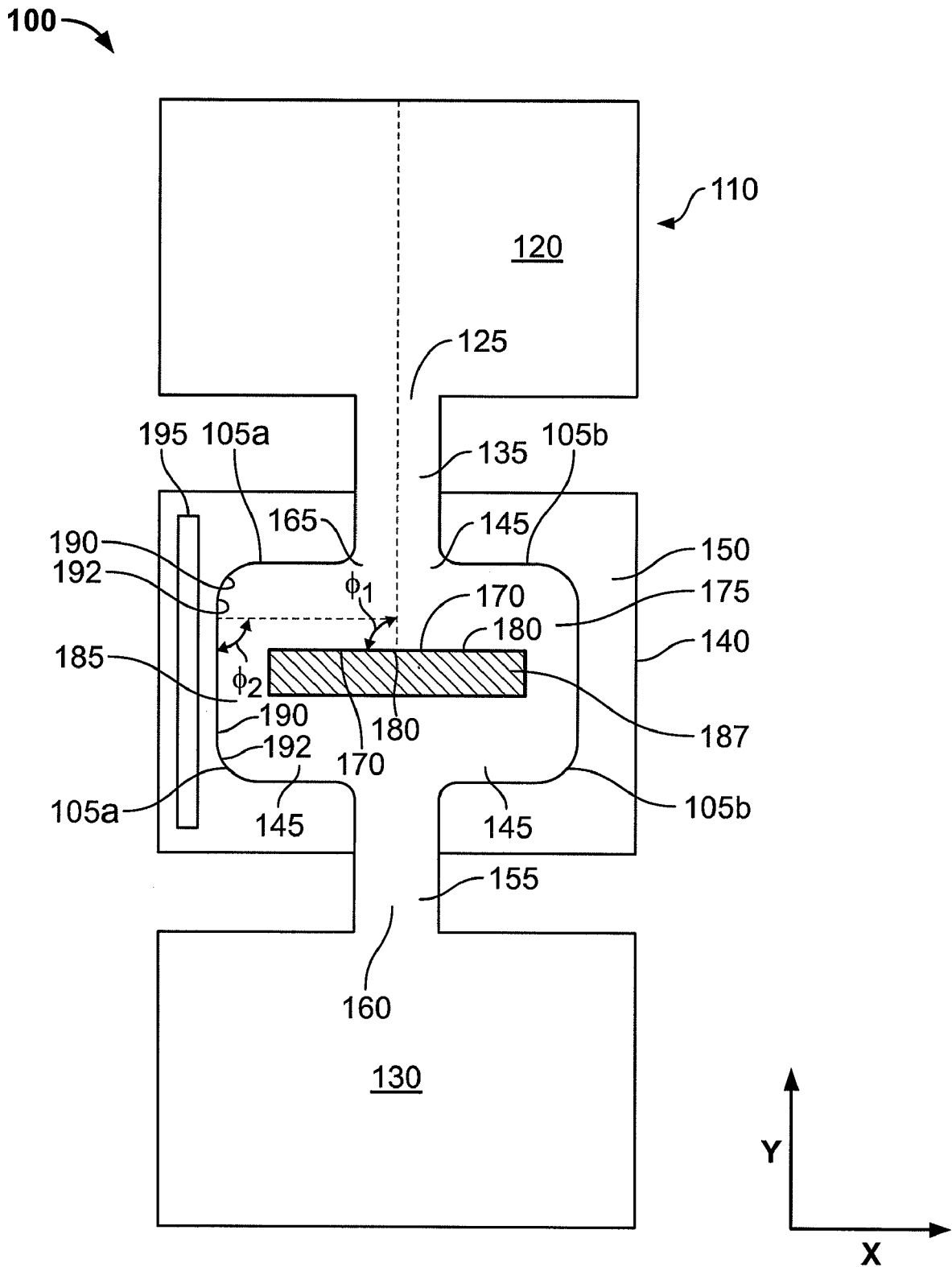
FIG. 1 is a schematic cross-sectional view of a plasma generation system, according to an illustrative embodiment of the invention.

FIG. 1 is a schematic cross-sectional view of a plasma generation system 100, according to an illustrative embodiment of the invention. The system 100 includes a remote plasma source 110, a process chamber 130, and a particle trap 140. An outlet 125 of the remote plasma source 110 is coupled to an inlet 135 of the particle trap 140. In some embodiments, the outlet 125 is directly coupled to the inlet 135. In some embodiments, the outlet 125 is indirectly coupled to the inlet 135 by, for example, a conduit or other suitable structure. The plasma is produced in a chamber 120 of the plasma source 110 by, for example, applying an electric potential of sufficient magnitude to a plasma gas (e.g., $O_2$, $N_2$, Ar, $NF_3$, $H_2$ and He), or a mixture of gases, to ionize at least a portion of the gas in the chamber 120. The plasma is used to activate additional gases introduced into the chamber 120 of the plasma source 110, placing the additional gases in an activated state such that the gases have, for example, an enhanced reactivity. The activated gases are directed out of the outlet 125 of the plasma source 110 and into the inlet 135 of the particle trap 140.

A gas channel 145 is created in a body structure 150 of the particle trap 140. The gas channel 145 is in fluid communication with the inlet 135 and an outlet 155 of the body structure 150. An obstruction 187 is located interior to exterior walls 105a and 105b of the body structure 150. The combination of the obstruction 187 and the exterior walls 105a and 105b defines the gas channel 145. The outlet 155 of the body structure 150 is coupled to an inlet 160 of the process chamber 130. In some embodiments, the outlet 155 is directly coupled to the inlet 160. In some embodiments, the outlet 155 is indirectly coupled to the inlet 160 by, for example, a conduit or other suitable structure. The gas channel 145 defines a path through the body structure 150 that causes particles in a gas directed from a first portion 165 of the channel 145 to strike a wall 170 of the obstruction 187 that defines a second portion 175 of the gas channel 145 at an angle $\Phi_1$ (e.g., in this embodiment, approximately 90 degrees), relative to a surface 180 of the wall 170. The momentum of the particles traveling along the first portion 165 (along the negative y-axis direction) of the gas channel 145 causes the particles to strike the surface 180 of the wall 170 when the path changes direction at the second portion 175 of the gas channel 145 (then traveling generally along the positive and negative x-axis directions). In some embodiments, the wall 170 is made out of a material (e.g., quartz, aluminum, or aluminum oxide) that has a high sticking coefficient, causing the particles to accumulate on the surface 180 of the wall 170. In some embodiments the angle $\theta_1$ is between approximately 45-135 degrees.

In this embodiment, the gas channel 145 has a third portion 185. Particles in the gas directed from the second portion 175 of the gas channel 145 strike a second wall 190 at a second angle $\Phi_2$ (e.g., in this embodiment, approximately 90 degrees) relative to a second surface 192 of the second wall 190. The momentum of the particles traveling along the second portion 175 of the gas channel 145 causes the particles to strike the second surface 192 of the second wall 190 when the path changes direction at the third portion 185 of the gas channel 145 (then traveling along the negative y-axis direction). In some embodiments, the wall 190 is made out of a material (e.g., quartz, aluminum, or aluminum oxide) that has a high sticking coefficient, causing the particles to accumulate on the wall 190. In some embodiments the second angle $\theta_2$ is between approximately 45-135 degrees. In some embodiments, the particle trap is configured to provide a pressure drop between the inlet 135 and the outlet 155 of the body structure 150 that is less than approximately 100 milli-Torr. High pressure drops can reduce the activity of the activated gas generated by the remote plasma source 110, and therefore reduce the effectiveness and utility of the plasma generation system.

A cooling member 195 is in thermal communication with the gas channel 145 adjacent the second wall 190. In this embodiment, the cooling member 195 is a cooling plate in a wall of the body structure 150. In some embodiments, the particle trap 140 includes a plurality of cooling members. In some embodiments, the cooling member 195 is cooled by a fluid (e.g., water). The cooling member 195 cools the second surface 192 of the second wall 190. In some embodiments, the second surface 192 of the second wall 190 is cooled to approximately 25-30° C. The particles entering the particle trap 140 via the inlet 135 have been thermally activated in the remote plasma source 120. In some embodiments, the gas entering the particle trap 140 is approximately 2000° C. The difference in temperature between the thermally-activated particles and the second surface 192 of the second wall 190 results in a local temperature gradient in the gas. The magnitude of a typical temperature gradient is greater than approximately 1000° C./cm. Gas species that absorb more plasma power (e.g., oxygen, nitrogen, hydrogen) will have larger temperature gradients than those that absorb less plasma power (e.g., argon). The temperature gradient imparts a force to the thermally-activated particles, called the thermophoretic force, that acts in the direction of steepest temperature descent. The low temperature of the second surface 192 of the second wall 190 creates the temperature gradient in the gas, so the thermophoretic force acts to push particles toward the colder second surface 192 of the second wall 190. Particles striking the second surface 192 of the second wall 190 accumulate due to a combination of the change in path direction, the high sticking properties of the material (e.g., quartz, aluminum, or aluminum oxide) of the second wall 190, and the thermophoretic force associated with the local temperature gradient.

The obstruction 187 can include a cooling member in thermal communication with the surface 180 of the wall 170 of the obstruction 187. In some embodiments, the cooling member includes a coolant channel to receive a fluid to cool the surface 180 of the wall 170 of the obstruction 187. In some embodiments, the particle trap includes a plurality of obstructions 187.

After the activated gas is directed through the particle trap 140, the activated gas is directed to the process chamber 130. Because particles accumulate on the surfaces 180 and 192 of the walls 170 and 190, respectively, the activated gas entering the process chamber 130 has less particles than the activated gas entering the particle trap 140.

In some embodiments, features incorporating principles of the invention are provided in (or, as a portion of) the plasma source 110. In some embodiments, the plasma source 110 is adapted to accommodate various features of the particle trap 140. For example, the gas channel 145 and walls 170 and 190 can be incorporated into the plasma source 110, and, during operation, the walls 170 and 190 can accumulate particles as described previously herein. In some embodiments, the cooling member 195 is incorporated into a portion (e.g., a portion of a wall of an outlet of the chamber 120 of the plasma source 110) creating a temperature gradient between the activated gases and a portion of the chamber to cause particles in the activated gases to migrate towards and adhere to the cooled portion of the chamber.

Figure 2:
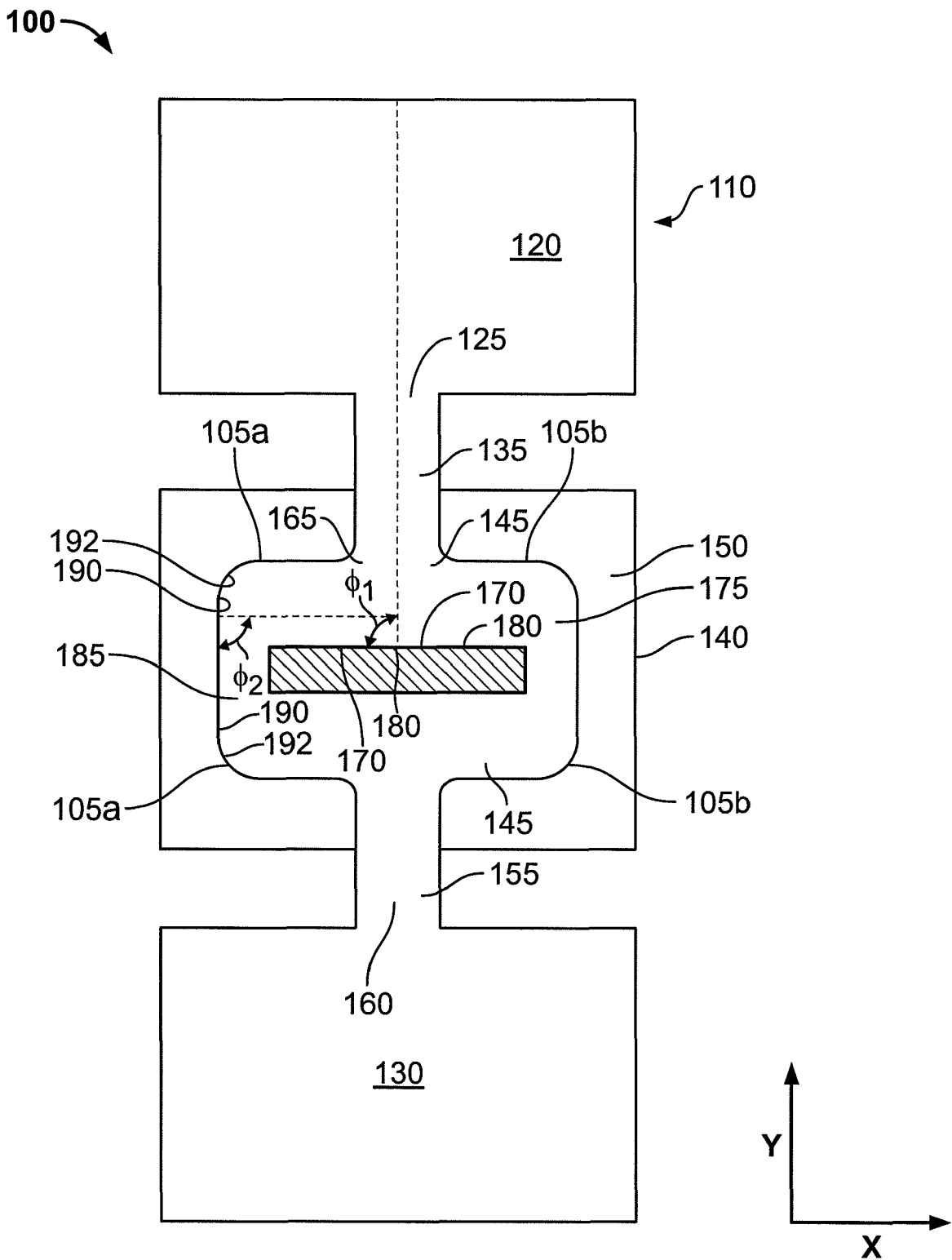
FIG. 2 is a schematic cross-sectional view of a plasma generation system without a cooling member, according to an illustrative embodiment.

FIG. 2 is a schematic cross-sectional view of a plasma generation system 100 without a cooling member, according to an illustrative embodiment of the invention. The system 100 includes a remote plasma source 110, a process chamber 130, and a particle trap 140. An outlet 125 of the remote plasma source 110 is coupled to an inlet 135 of the particle trap 140. In some embodiments, the outlet 125 is directly coupled to the inlet 135. In some embodiments, the outlet 125 is indirectly coupled to the inlet 135 by, for example, a conduit or other suitable structure. Activated gases are directed out of the outlet 125 of the plasma source 110 and into the inlet 135 of the particle trap 140.

A gas channel 145 is formed in a body structure 150 of the particle trap 140. The gas channel 145 is in fluid communication with the inlet 135 and an outlet 155 of the body structure 150. The outlet 155 of the body structure 150 is coupled to an inlet 160 of the process chamber 130. In some embodiments, the outlet 155 is directly coupled to the inlet 160. In some embodiments, the outlet 155 is indirectly coupled to the inlet 160 by, for example, a conduit or other suitable structure. The gas channel 145 defines a path through the body structure 150 that causes particles in a gas directed from a first portion 165 of the channel 145 to strike a wall 170 that defines a second portion 175 of the gas channel 145 at an angle $\Phi_1$ (e.g., in this embodiment, approximately 90 degrees), relative to a surface 180 of the wall 170. The momentum of the particles traveling along the first portion 165 (along the negative y-axis direction) of the gas channel 145 causes the particles to strike the surface 180 of the wall 170 when the path changes direction at the second portion 175 of the gas channel 145 (then traveling generally along the positive and negative x-axis directions). In some embodiments, the wall 170 is made out of a material (e.g., quartz, aluminum, or aluminum oxide) that has a high sticking coefficient, causing the particles to accumulate on the surface 180 of the wall 170. In some embodiments the angle $\theta_1$ is between approximately 45-135 degrees.

In this embodiment, the gas channel 145 has a third portion 185. Particles in the gas directed from the second portion 175 of the gas channel 145 strike a second wall 190 at a second angle $\Phi_2$ (e.g., in this embodiment, approximately 90 degrees) relative to a second surface 192 of the second wall 190. The momentum of the particles traveling along the second portion 175 of the gas channel 145 causes the particles to strike the second surface 192 of the second wall 190 when the path changes direction at the third portion 185 of the gas channel 145 (then traveling along the negative y-axis direction). In some embodiments, the wall 190 is made out of a material (e.g., quartz, aluminum, or aluminum oxide) that has a high sticking coefficient, causing the particles to accumulate on the wall 190. In some embodiments the second angle $\theta_2$ is between approximately 45-135 degrees.

After the activated gas is directed through the particle trap 140, the activated gas is directed to the process chamber 130. Because particles accumulate on the surfaces 180 and 192 of the walls 170 and 190 respectively, the activated gas entering the process chamber 130 has less particles than the activated gas entering the particle trap 140.

Figure 3:
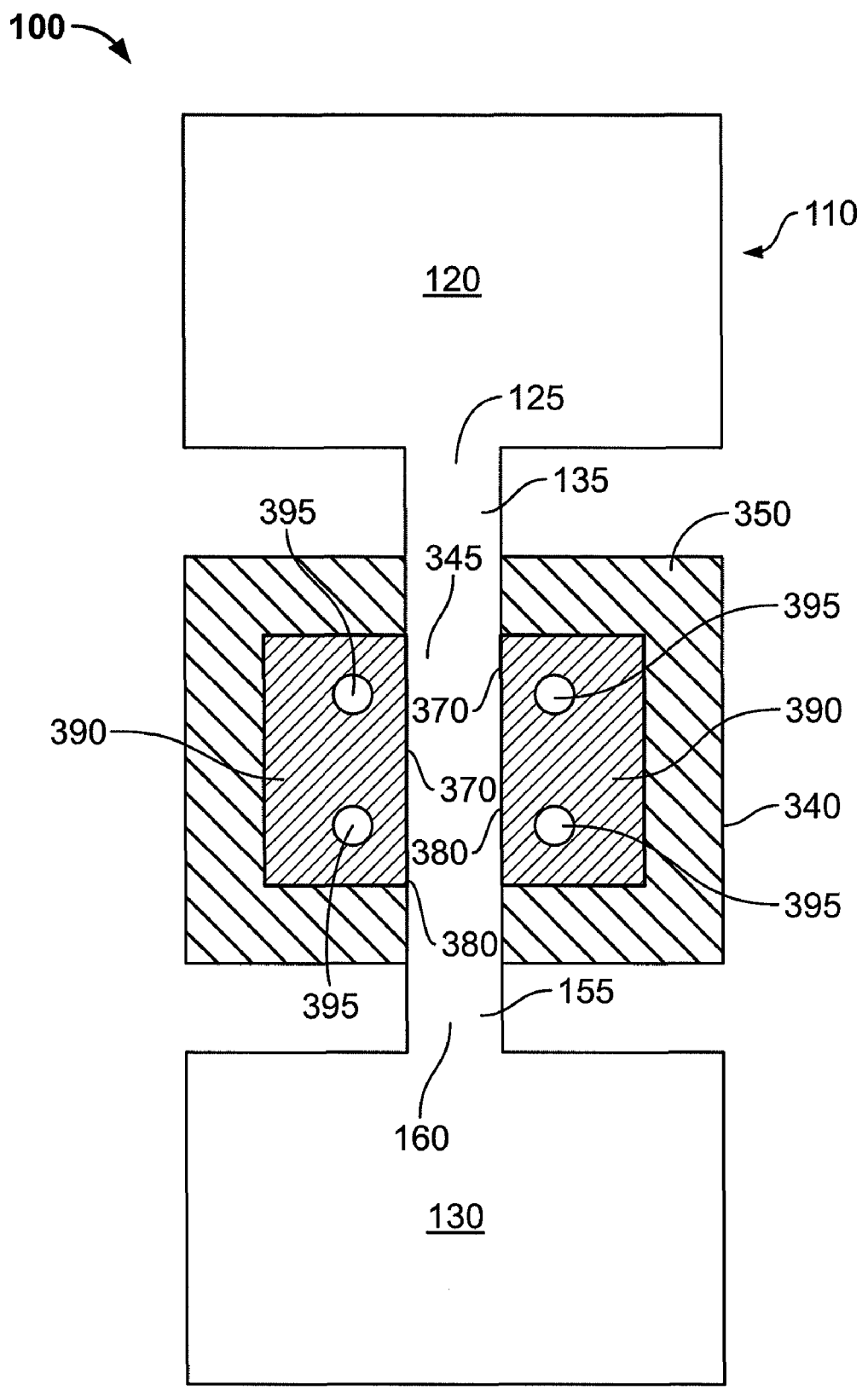
FIG. 3 is a schematic cross-sectional view of a plasma generation system, according to an illustrative embodiment of the invention.

FIG. 3 is a schematic cross-sectional view of a plasma generation system 100, according to an illustrative embodiment of the invention. The system 100 includes a remote plasma source 110, a process chamber 130, and a particle trap 340. An outlet 125 of the remote plasma source 110 is coupled to an inlet 135 of the particle trap 340. In some embodiments, the outlet 125 is directly coupled to the inlet 135. In some embodiments, the outlet 125 is indirectly coupled to the inlet 135 by, for example, a conduit or other suitable structure. Activated gases are directed out of the outlet 125 of the plasma source 110 and into the inlet 135 of the particle trap 340.

A gas channel 345 is created in a body structure 350 of the particle trap 340. The gas channel 345 is in fluid communication with the inlet 135 and an outlet 155 of the body structure 350. The outlet 155 of the body structure 350 is coupled to an inlet 160 of the process chamber 130. In some embodiments, the outlet 155 is directly coupled to the inlet 160. In some embodiments, the outlet 155 is indirectly coupled to the inlet 160 by, for example, a conduit or other suitable structure. In some embodiments, the particle trap is configured to provide a pressure drop between the inlet 135 and the outlet 155 of the body structure 150 that is less than approximately 100 milliTor. High pressure drops can reduce the activity of the activated gas generated by the remote plasma source 110.

A cooling member 390 is in thermal communication with the gas channel 345 adjacent a wall 370. The cooling member 390 cools at least a portion of the wall 370, including a surface 380 of the wall 370. In some embodiments, the surface 380 of the wall 370 is cooled to approximately 25-30° C. The cooling member 390 has a plurality of cooling channels 395. Coolant (e.g., water) flows through the channels 395 to cool the cooling member 390 and the wall 370. Particles entering the particle trap 340 via the inlet 135 have been thermally activated in the remote plasma source 120. In some embodiments, the gas entering the particle trap 340 is approximately 2000° C. The difference in temperature between the thermally activated particles and the surface 380 of the wall 370 results in a local temperature gradient. The magnitude of a typical temperature gradient is greater than approximately 1000° C./cm. Gas species that absorb more plasma power (e.g., oxygen, nitrogen, hydrogen) will have larger temperature gradients than those that absorb less plasma power (e.g., argon). The temperature gradient imparts a force to the thermally-activated particles, called the thermophoretic force, that acts in the direction of steepest temperature descent. The low temperature of the surface 380 of the wall 370 creates the temperature gradient in the gas, so the thermophoretic force acts to push particles toward the colder surface 380 of the wall 370. In some embodiments, the wall 370 can be made out of a material (e.g., quartz, aluminum, or aluminum oxide) that has a high sticking coefficient, causing the particles to accumulate on the surface 380 of the wall 370.

After the activated gas is directed through the particle trap 340, the activated gas is directed to the process chamber 130. Because particles accumulate on the surface 380 of the wall 390, the activated gas entering the process chamber 130 has less particles than the activated gas entering the particle trap 340.

Figure 4:
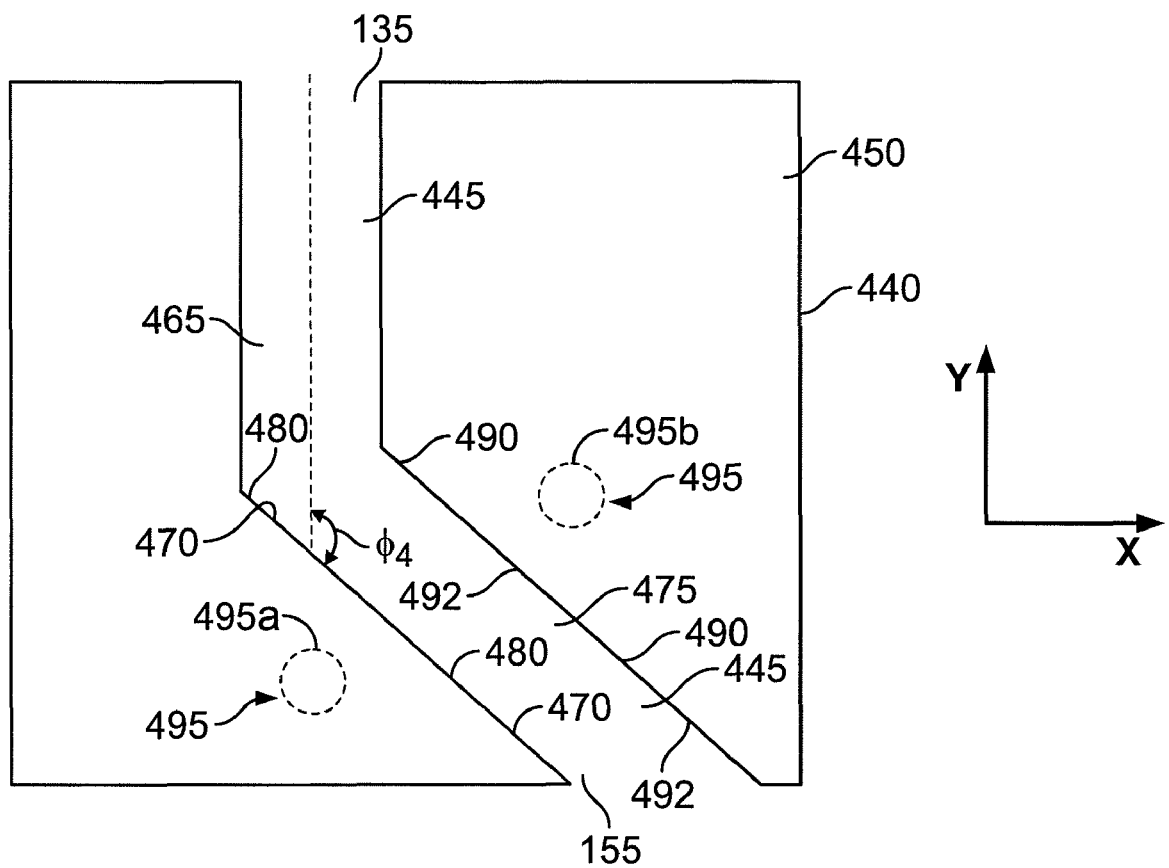
FIG. 4 is a schematic cross-sectional view of a particle trap, according to an illustrative embodiment of the invention.

FIG. 4 is a schematic cross-sectional view of a particle trap 440, according to an illustrative embodiment of the invention. The particle trap 440 can be used in a plasma generation system (e.g., the plasma generation system 100 of FIG. 1, 2, or 3). The particle trap 440 has an inlet 135 that can be coupled to an outlet of a remote plasma source (e.g., the outlet 125 of the remote plasma source 110 of FIG. 1, 2, or 3). The particle trap 440 has an outlet 155 that can be coupled to the inlet of a process chamber (e.g., the inlet 160 of the process chamber 130 of FIG. 1, 2, or 3). In some embodiments, the body structure 150 is disposed in a chamber (e.g., the chamber 120 of FIG. 1, 2, or 3) of the remote plasma source (e.g., the remote plasma source 110 of FIG. 1, 2, or 3).

A gas channel 445 is formed in a body structure 450 of the particle trap 440 and is in fluid communication with the inlet 135 and the outlet 155. The gas channel 145 defines a path through the body structure 450 that causes particles in a gas passing from a first portion 465 of the gas channel 445 to strike a wall 470 that defines a second portion 475 of the gas channel 445 at an angle $\Phi_4$ (in this embodiment, approximately 135 degrees) relative to a surface 480 of the wall 470. The momentum of the particles traveling along the first portion 465 of the gas channel 445 causes the particles to strike the surface 480 of the wall 470 when the path changes direction at the second portion 475 of the gas channel 445. In some embodiments, the wall 470 is made out of a material (e.g., quartz, aluminum, or aluminum oxide) that has a high sticking coefficient, causing the particles to accumulate on the wall 470. In some embodiments, the first portion 465 is at a substantially normal angle (e.g., $\Phi_4$ is substantially equal to 90 degrees) to the second portion 475 of the gas channel 445. In some embodiments, $\theta_4$ is between approximately 45-135 degrees.

Optional coolant channels 495a and 495b (collectively, cooling member 495) are included in alternative embodiments of the invention. The cooling member 495 is in thermal communication with the gas channel 445. The coolant channel 495a is formed in the body structure 450 to receive a fluid (e.g., water) to cool at least a portion of the wall 470, including the surface 480 of the wall 470, of the second portion 475 of the gas channel 445. In some embodiments, the surface 480 of the wall 470 is cooled to approximately 25-30° C. The particles entering the particle trap 140 have been thermally activated in the remote plasma source. In some embodiments, the gas entering the particle trap 140 is approximately 2000° C. The difference in temperature between the thermally-activated particles and the surface 480 of the wall 470 results in a local temperature gradient. The magnitude of a typical temperature gradient is greater than approximately 1000° C./cm. Gas species that absorb more plasma power (e.g., oxygen, nitrogen, hydrogen) will have larger temperature gradients than those that absorb less plasma power (e.g., argon). The local temperature gradient imparts a force to the thermally-activated particles, called the thermophoretic force, that acts in the direction of steepest temperature descent. The low temperature of the surface 480 of the wall 470 creates the temperature gradient in the gas, so the thermophoretic force acts to push particles toward the colder surface 480 of the wall 470. Particles striking the surface 480 of the wall 470 accumulate due to a combination of the change in path direction, the high sticking properties of the material (e.g., quartz, aluminum, or aluminum oxide) of the wall 490, and the thermophoretic force associated with the local temperature gradient.

In some embodiments, the coolant channel 495a is disposed outside the particle trap 440. In those embodiments, the coolant channel 495a indirectly cools at least a portion of the wall 470, including the surface 480 of the wall 470, of the second portion 475 of the gas channel 445 through the body structure 450. In one embodiment, the coolant channel 495a is external to the particle trap 440 and is coupled to a wall of the particle trap with a thermally conductive bonding material. In some embodiments, the coolant channel 495a is disposed orthogonally to the coolant channel depicted in FIG. 4, such that a path of the coolant channel 495a is at least substantially parallel to the path of the gas channel adjacent the surface 480 of the wall 470.

The coolant channel 495b is formed in the body structure 450 to receive a fluid to cool at least a portion of the interior wall 490. The difference in temperature between the thermally-activated particles and the interior wall 490 results in a second local temperature gradient. The second local temperature gradient causes the thermally-activated particles that were not attracted to the wall 470 to be attracted to the low temperature of the wall 490 due to a thermophoretic force associated with the second temperature gradient. In some embodiments, the coolant channel 495b is disposed outside the particle trap 440. In those embodiments, the coolant channel 495a indirectly cools at least a portion of the wall 490, including a surface 492 of the wall 490, of the second portion 475 of the gas channel 445 through the body structure 450. In some embodiments, the coolant channel 495b is disposed orthogonally to the coolant channel depicted in FIG. 4, such that a path of the coolant channel 495a is at least substantially parallel to the path of the gas channel 445 adjacent the surface 492 of the wall 490.

After the activated gas is directed through the particle trap 440, the activated gas can be directed to the process chamber. Because particles accumulate on the surfaces 480 and 490 of the walls 470 and 490 respectively, the activated gas entering the process chamber has less particles than the activated gas entering the particle trap 440.

Figure 5A:
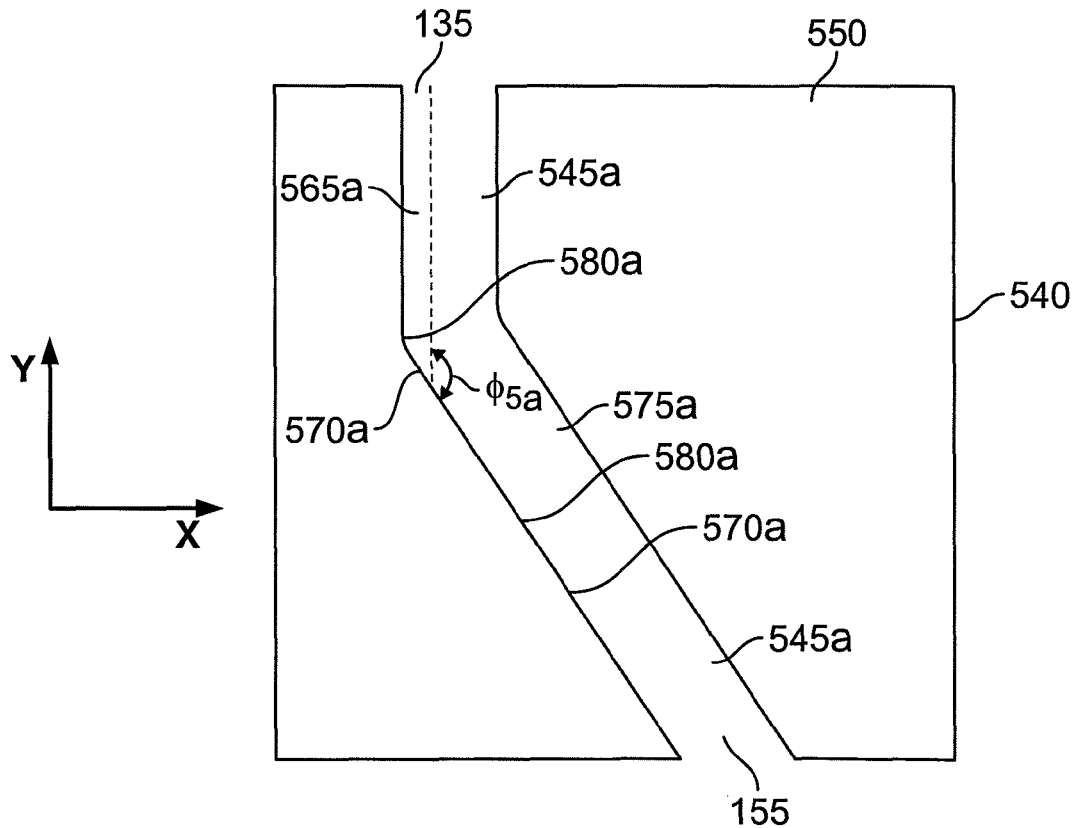
FIGS. 5A and 5B are schematic cross-sectional views of different embodiments of a particle trap.
Figure 5B:
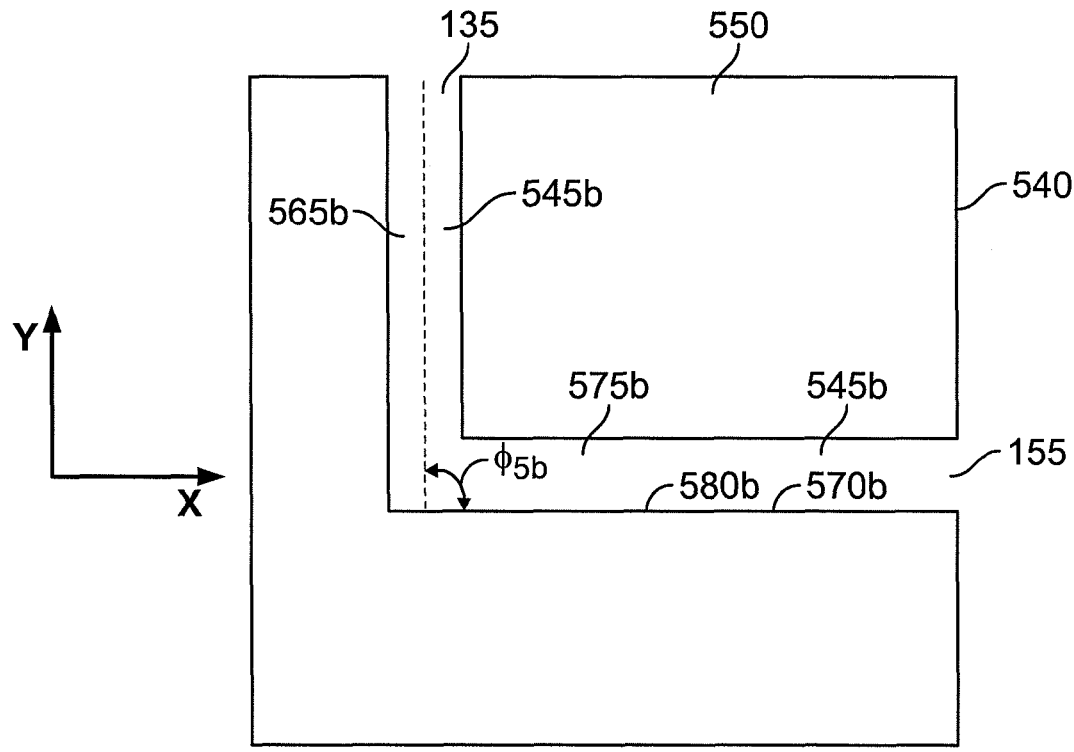

FIGS. 5A and 5B are schematic cross-sectional views of different illustrative embodiments of a particle trap 540. The particle trap 540 can be used in a plasma generation system (e.g., the plasma generation system 100 of FIG. 1, 2, or 3). The particle trap 540 has an inlet 135 that can be coupled to an outlet of a remote plasma source (e.g., the outlet 125 of the remote plasma source 110 of FIG. 1, 2, or 3). The particle trap 540 has an outlet 155 that can be coupled to the inlet of a process chamber (e.g., the inlet 160 of the process chamber 130 of FIG. 1, 2, or 3). A gas channel 545 is formed in a body structure 550 of the particle trap 540 and is in fluid communication with the inlet 135 and the outlet 155.

Referring to FIG. 5A, the gas channel 545a defines a path through the body structure 550 that causes particles in a gas passing from a first portion 565a (e.g., along a negative y axis) of the gas channel 545a to strike a wall 570a that defines a second portion 575a of the gas channel 545a having a local angle $\Phi_{5a}$ (in this embodiment, approximately 135 degrees) relative to a surface 580a of the wall 570a. In this embodiment, the first portion 565a and the second portion 575a form a curved portion of the path of the channel 545a. The momentum of the particles traveling along the first portion 565a of the gas channel 545a causes the particles to strike the surface 580a of the wall 570a when the path changes direction at the second portion 575a of the gas channel 545a. In some embodiments, the wall 570a is made out of a material (e.g., quartz, aluminum, or aluminum oxide) that has a high sticking coefficient, causing the particles to accumulate on the surface 580a of the wall 570a. In some embodiments, the local angle $\Phi_{5a}$ is between approximately 45-135 degrees.

After the activated gas is directed through the particle trap 540, the activated gas can be directed to a process chamber. Because particles accumulate on the surface 580a of the wall 570a, the activated gas entering the process chamber has less particles than the activated gas entering the particle trap 540.

Referring to FIG. 5B, the gas channel 545b defines a path through the body structure 550 that causes particles in a gas passing from a first portion 565b (e.g., along the negative y axis) of the gas channel 545b to strike a surface 580b of a wall 570b that defines a second portion 575b of the gas channel 545b at an angle $\Phi_{5b}$ relative to the surface 580b of the wall 570b. In this embodiment, the first portion 565b of the gas channel 545b is at a substantially normal angle to the second portion 575b (e.g., $\Phi_{5b}$ is substantially equal to 90 degrees). The momentum of the particles traveling along the first portion 565b of the gas channel 545b causes the particles to strike the surface 580b of the wall 570b when the path changes direction at the second portion 575b of the gas channel 545b. In some embodiments, the wall 570b is made out of a material (e.g., quartz, aluminum, or aluminum oxide) that has a high sticking coefficient, causing the particles to accumulate on the surface 580b of the wall 570b.

After the activated gas is directed through the particle trap 540, the activated gas can be directed to the process chamber. Because particles accumulate on the surface 580a of the wall 570a, the activated gas entering the process chamber has less particles than the activated gas entering the particle trap 540.

Figure 6:
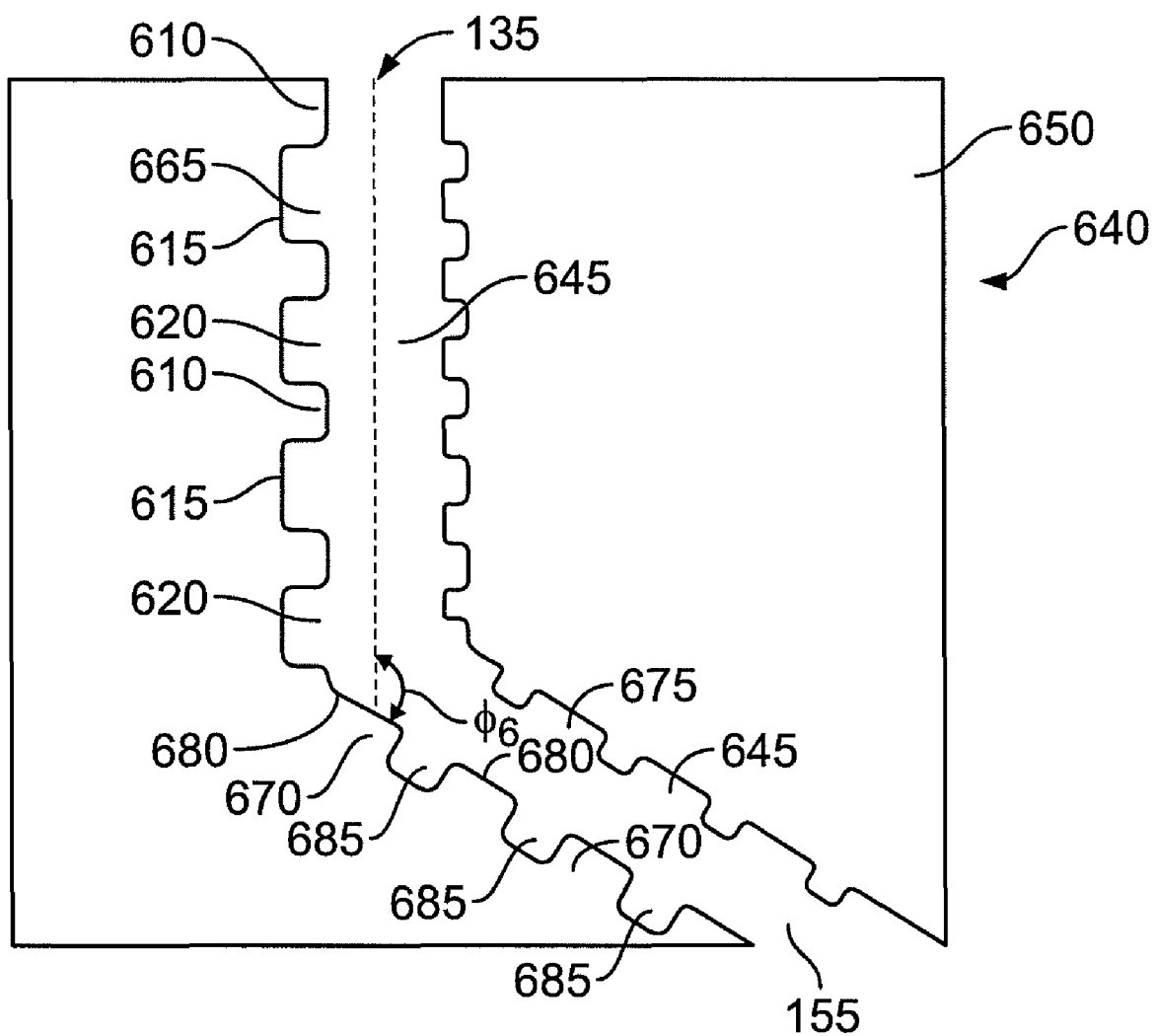
FIG. 6 is a schematic cross-sectional view of a particle trap, according to an illustrative embodiment of the invention.

FIG. 6 is a schematic cross-sectional view of a particle trap 640, according to an illustrative embodiment of the invention. The particle trap 640 can be used in a plasma generation system (e.g., the plasma generation system 100 of FIG. 1, 2, or 3). The particle trap 640 has an inlet 135 that can be coupled to an outlet of a remote plasma source (e.g., the outlet 125 of the remote plasma source 110 of FIG. 1, 2, or 3). The particle trap 640 has an outlet 155 that can be coupled to the inlet of a process chamber (e.g., the inlet 160 of the process chamber 130 of FIG. 1, 2, or 3). A gas channel 645 is formed in a body structure 650 of the particle trap 640 and is in fluid communication with the inlet 135 and the outlet 155. The gas channel 645 defines a path through the body structure 650 that causes particles in a gas passing from a first portion 665 of the gas channel 645 to strike a second surface 680 of a second wall 670 that defines a second portion 675 of the gas channel 645 at an angle $\Phi_6$ (in this embodiment, approximately 135 degrees) relative to the second surface 680 of the wall 670. The momentum of the particles traveling along the first portion 665 of the gas channel 645 causes the particles to strike the second surface 680 of the second wall 670 when the path changes direction at the second portion 675 of the gas channel 645.

In this embodiment, a first surface 615 of a first wall 610 is irregular, providing a plurality of depressions 620 on the first surface 615 of the first wall 610. The particles traveling along the first section 665 of the gas channel 645 strike the first surface 615 of the first wall 610, including the depressions 620. Particles in the gas traveling along the first portion 665 of the gas channel 645 are trapped by the depressions 620. In some embodiments, the first wall 610 is made out of a material (e.g., quartz, aluminum, or aluminum oxide) that has a high sticking coefficient, which further facilitates to the accumulation of particles on the first surface 615 of the first wall 610.

The second surface 680 of the second wall 670 is irregular, providing a plurality of depressions 685 on the second surface 680 of the second wall 670. The particles traveling from the first section 665 of the gas channel 645 strike the second surface 680 of the second wall 670 in a distribution along the second surface 680 of the second wall 670. Particles traveling along the second portion 675 of the gas channel 645 strike the second surface 680 of the second wall 670, including the depressions 685. Particles in the gas traveling along the second portion 675 of the gas channel 645 are trapped by the depressions 685 to prevent the particles from being dislodged by mechanical vibration in the system. In some embodiments, at least one of the surfaces 615 or 680 of the walls 610 or 670 respectively is at least partially irregular. In some embodiments, only one of the walls 610 or 670 is at least partially irregular. In some embodiments, at least one of the surfaces 615 or 680 is textured. A textured surface increases the likelihood that particles will adhere to the surfaces 615 or 680 because the textured surface has local pockets or depressions in which particles can be trapped.

In some embodiments, the second wall 670 is made out of a material (e.g., quartz, aluminum, or aluminum oxide) that has a high sticking coefficient, causing the particles to accumulate on the wall 470. In some embodiments, the first portion 665 is at a substantially normal angle (e.g., $\theta_6$ is approximately 90 degrees) to the second portion 675 of the gas channel 645. In some embodiments, $\Phi_6$ is between approximately 45-135 degrees.

After the activated gas is directed through the particle trap 640, the activated gas can be directed to the process chamber. Because particles accumulate on the surfaces 615 or 680 of the walls 610 or 670 respectively, the activated gas entering the process chamber has less particles than the activated gas entering the particle trap 640.

Figure 7:
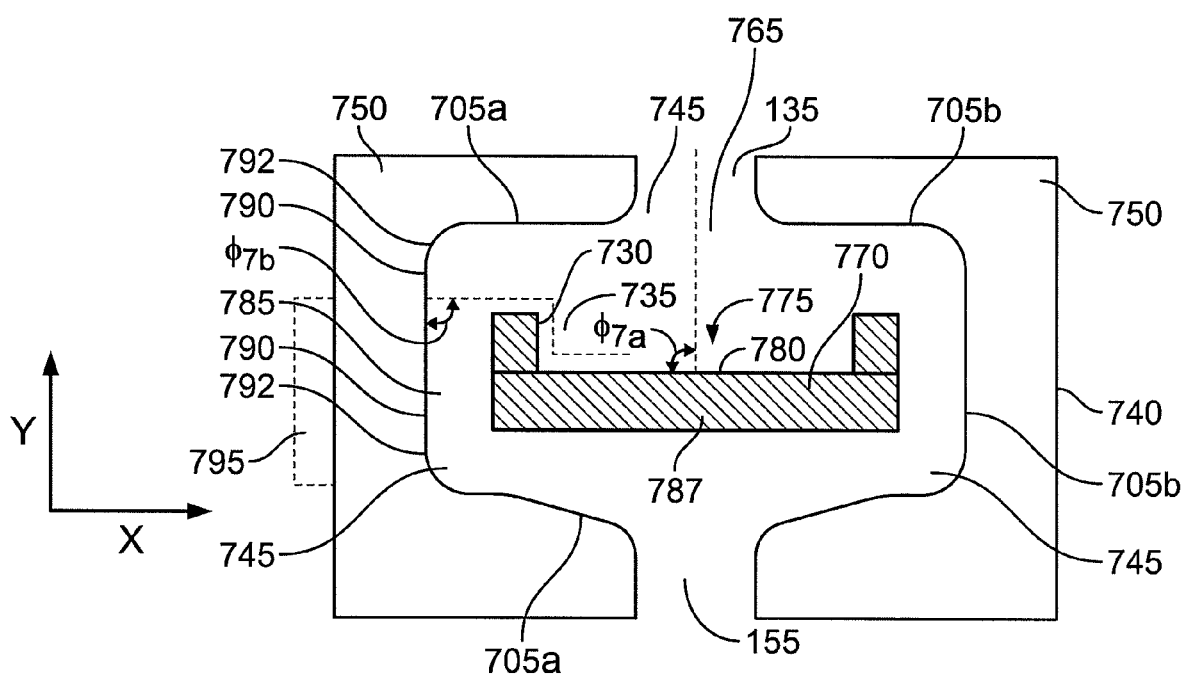
FIG. 7 is a schematic cross-sectional view of a particle trap, according to an illustrative embodiment of the invention.

FIG. 7 is a schematic cross-sectional view of a particle trap 740, according to an illustrative embodiment of the invention. The particle trap 740 can be used in a plasma generation system (e.g., the plasma generation system 100 of FIG. 1, 2, or 3). The particle trap 740 has an inlet 135 that can be coupled to an outlet of a remote plasma source (e.g., the outlet 125 of the remote plasma source 110 of FIG. 1, 2, or 3). The particle trap 740 has an outlet 155 that can be coupled to the inlet of a process chamber (e.g., the inlet 160 of the process chamber 130 of FIG. 1, 2, or 3).

A gas channel 745 is created in a body structure 750 of the particle trap 740 and is in fluid communication with the inlet 135 and the outlet 155. An obstruction 787 is located interior to exterior walls 705a and 705b of the body structure 750. The combination of the obstruction 787 and the exterior walls 705a and 705b defines the gas channel 145. The gas channel 745 defines a path through the body structure 750 that causes particles in a gas passing from a first portion 765 (e.g., along the negative y-axis direction) of the gas channel 745 to strike a surface 780 of a wall 770 of the obstruction 787 that defines a second portion 775 of the gas channel 745 at an angle $\Phi_{7a}$ (in this embodiment, approximately 90 degrees) relative to the surface 780 of the wall 770. The momentum of the particles traveling along the first portion 765 of the gas channel 745 causes the particles to strike the surface 780 of the wall 770 when the path changes direction at the second portion 775 of the gas channel 745. In this embodiment, the wall 770 includes a depression 735. Particles traveling along the second portion 775 (e.g., along the positive and negative x-axis directions) strike a surface 730 in the depression 735 of the wall 770. The depression 735 traps the particles away from the gas flowing along the second portion 775 of the gas channel 745, causing the particles to accumulate on the surface 730 of the depression 735 and serves to prevent the particles from being dislodged by mechanical vibration in the system. In some embodiments, the wall 770 is made out of a material (e.g., quartz, aluminum, or aluminum oxide) that has a high sticking coefficient, causing the particles to accumulate on the surface 780 of the wall 770 or the surface 730 of the depression 735 of the wall 770. In some embodiments, the angle $\Phi_{7a}$ is between approximately 45-135 degrees.

In some embodiments, the obstruction 787 includes a depression (e.g., the depression 735). The obstruction 787 can include a cooling member in thermal communication with the surface 780 of the wall 770 of the obstruction 787. In some embodiments, the cooling member includes a coolant channel to receive a fluid to cool the surface 780 of the wall 770 of the obstruction 787. In some embodiments, the particle trap includes a plurality of obstructions 787.

Still referring to FIG. 7, the gas channel 745 has a third portion 785. Particles in the gas directed from the second portion 775 of the gas channel 745 (e.g., along the positive and negative x-axis directions) strike a second surface 792 of a second wall 790 at a second angle $\Phi_{7b}$ (in this embodiment, approximately 90 degrees) relative to the second surface 792 of the second wall 790. The momentum of the particles traveling along the second portion 775 of the gas channel 745 causes the particles to strike the second surface 792 of the second wall 790 when the path changes direction at the third portion 785 of the gas channel 745. In some embodiments, the wall 790 is made out of a material (e.g., quartz, aluminum, or aluminum oxide) that has a high sticking coefficient, causing the particles to accumulate on the wall 790. In some embodiments, the second angle $\Phi_{7b}$ is between approximately 45-135 degrees. In some embodiments, the second wall 790 includes a depression.

Optional cooling member 795 is in thermal communication with the gas channel 745 adjacent the second wall 790. The cooling member 795 indirectly cools the second surface 792 of the second wall 790 through the body structure 750. In some embodiments, the second surface 792 of the second wall 790 is cooled to approximately 25-30° C. The particles entering the particle trap 740 are thermally activated from processing in the remote plasma source. In some embodiments, the gas entering the particle trap 740 is approximately 2000° C. The difference in temperature between the thermally-activated particles and the wall 770 results in a local temperature gradient. The magnitude of a typical temperature gradient is greater than approximately 1000° C./cm. Gas species that absorb more plasma power (e.g., oxygen, nitrogen, hydrogen) will have larger temperature gradients than those that absorb less plasma power (e.g., argon). The local temperature gradient imparts a force to the thermally-activated particles, called the thermophoretic force, that acts in the direction of steepest temperature descent. The low temperature of the second surface 792 of the second wall 790 creates the temperature gradient in the gas, so the thermophoretic force acts to push particles toward the colder second surface 792 of the second wall 790. Particles striking the second surface 792 of the second wall 790 accumulate due to a combination of the change in path direction, the high sticking properties of the material (e.g., quartz, aluminum, or aluminum oxide) of the second wall 790, and the thermophoretic force associated with the local temperature gradient.

After the activated gas is directed through the particle trap 740, the activated gas can be directed to the process chamber. Because particles accumulate on the surfaces 780, 730, and 792, the activated gas entering the process chamber has less particles than the activated gas entering the particle trap 740.

Figure 8:
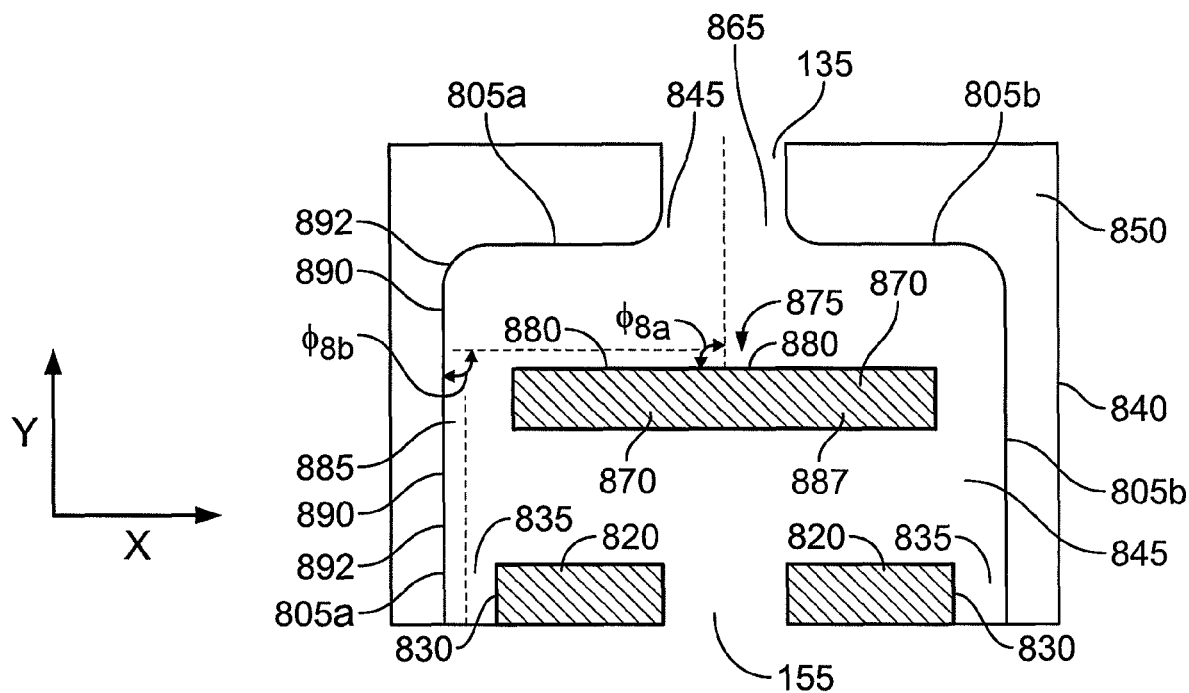
FIG. 8 is a schematic cross-sectional view of a particle trap, according to an illustrative embodiment of the invention.

FIG. 8 is a schematic cross-sectional view of a particle trap 840, according to an illustrative embodiment of the invention. The particle trap 840 can be used in a plasma generation system (e.g., the plasma generation system 100 of FIG. 1, 2, or 3). The particle trap 840 has an inlet 135 that can be coupled to an outlet of a remote plasma source (e.g., the outlet 125 of the remote plasma source 110 of FIG. 1, 2, or 3). The particle trap 840 has an outlet 155 that can be coupled to the inlet of a process chamber (e.g., the inlet 160 of the process chamber 130 of FIG. 1, 2, or 3).

A gas channel 845 is formed in a body structure 850 of the particle trap 840 and is in fluid communication with the inlet 135 and the outlet 155. An obstruction 887 is located interior to exterior walls 805a and 805b of the body structure 850. The combination of the obstruction 887 and the exterior walls 805a and 805b defines the gas channel 845. The gas channel 845 defines a path through the body structure 850 that causes particles in a gas passing from a first portion 865 (e.g., along the negative y-axis direction) of the gas channel 845 to strike a surface 880 of a wall 870 of the obstruction 887 that defines a second portion 875 of the gas channel 845 at an angle $\Phi_{8a}$ (e.g., in this embodiment, approximately 90 degrees) relative to a surface 880 of the wall 870. The momentum of the particles traveling along the first portion 865 of the gas channel 845 causes the particles to strike the surface 880 of the wall 870 when the path changes direction at the second portion 875 of the gas channel 845. In some embodiments, the wall 870 is made out of a material (e.g., quartz, aluminum, or aluminum oxide) that has a high sticking coefficient, causing the particles to accumulate on the surface 880 of the wall 870. In some embodiments, the angle $\Phi_{8a}$ is between approximately 45-135 degrees. In some embodiments, the first wall 870 includes at least one depression (e.g., the depression 735 of FIG. 7).

Still referring to FIG. 8, the gas channel 845 has a third portion 885. Particles in the gas directed from the second portion 875 of the gas channel 845 (e.g., along the positive and negative x-axis directions) strike a second surface 892 of a second wall 890 at a second angle $\Phi_{8b}$ (e.g., in this embodiment, approximately 90 degrees) relative to the second surface 892 of the second wall 890. The momentum of the particles traveling along the second portion 875 of the gas channel 845 causes the particles to strike the second surface 892 of the second wall 890 when the path changes direction at the third portion 885 of the gas channel 845.

In some embodiments, the wall 890 is made out of a material (e.g., quartz, aluminum, or aluminum oxide) that has a high sticking coefficient, causing the particles to accumulate on the wall 890. In some embodiments, the second angle $\Phi_{8b}$ is between approximately 45-135 degrees. In some embodiments, the second wall 890 includes a depression.

In this embodiment, the third portion 885 includes a depression 835 in a third wall 820. Particles traveling along the third portion 885 (e.g., along the negative y-axis direction) enter the depression 835 of the third wall 820. The particles strike a third surface 830 of the third wall 820. The depression 835 traps particles in the gas that flow along the third portion 885 of the gas channel 845, causing the particles to accumulate on the third surface 830 of the depression 835 and serves to prevent the particles from being dislodged by mechanical vibration in the system. In some embodiments, the third wall 820 is made out of a material (e.g., quartz, aluminum, or aluminum oxide) that has a high sticking coefficient, causing the particles to accumulate on the third wall 820. In some embodiments, a cooling member is in thermal communication with the depression 835 in the third wall 820 to enhance the particle trapping properties of the particle trap 840.

After the activated gas is directed through the particle trap 840, the activated gas can be directed to the process chamber. Because particles accumulate on the surfaces 880, 892, and 830, the activated gas entering the process chamber has less particles than the activated gas entering the particle trap 840.

Figure 9:
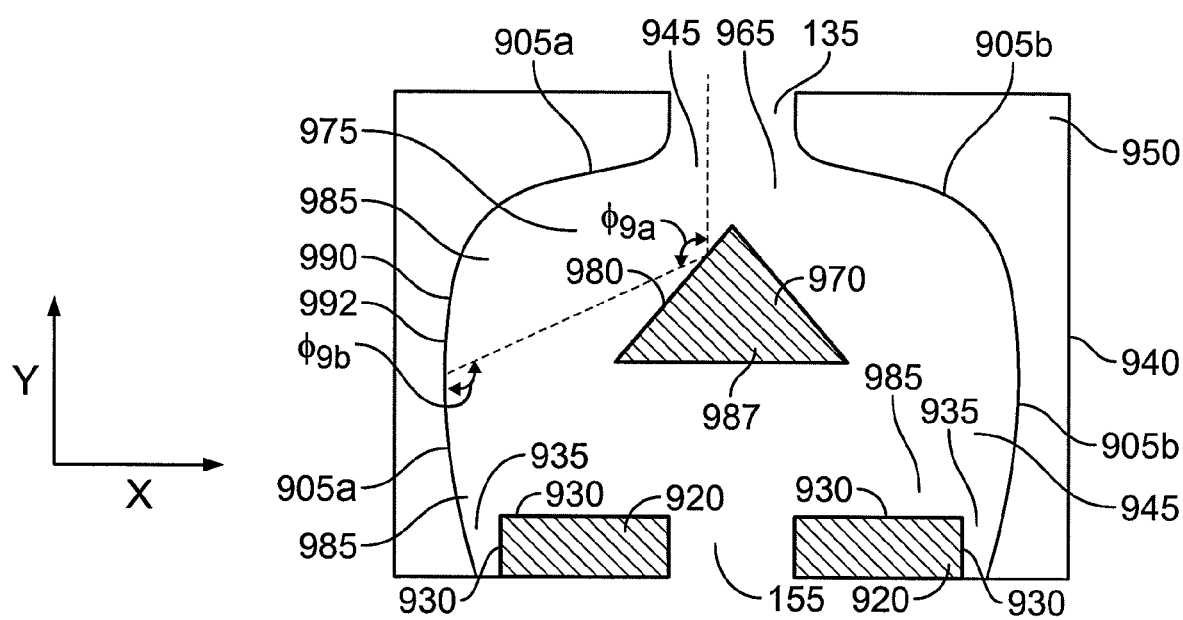
FIG. 9 is a schematic cross-sectional view of a particle trap, according to an illustrative embodiment of the invention.

FIG. 9 is a schematic cross-sectional view of a particle trap 940, according to an illustrative embodiment of the invention. The particle trap 940 can be used in a plasma generation system (e.g., the plasma generation system 100 of FIG. 1, 2, or 3). The particle trap 940 has an inlet 135 that can be coupled to an outlet of a remote plasma source (e.g., the outlet 125 of the remote plasma source 110 of FIG. 1, 2, or 3). The particle trap 940 has an outlet 155 that can be coupled to the inlet of a process chamber (e.g., the inlet 160 of the process chamber 130 of FIG. 1, 2, or 3).

A gas channel 945 is formed in a body structure 950 of the particle trap 940 and is in fluid communication with the inlet 135 and the outlet 155. An obstruction 987 is located interior to exterior walls 905a and 905b of the body structure 950. The combination of the obstruction 987 and the exterior walls 905a and 905b defines the gas channel 945. The gas channel 945 defines a path through the body structure 950 that causes particles in a gas passing from a first portion 965 (e.g., along the negative y-axis direction) of the gas channel 945 to strike a surface 980 of a first wall 970 that defines a second portion 975 of the gas channel 945 at an angle $\Phi_{9a}$ (e.g., in this embodiment, approximately 120 degrees) relative to the surface 980 of the first wall 970. The momentum of the particles traveling along the first portion 965 of the gas channel 945 causes the particles to strike the surface 980 of the first wall 970 when the path changes direction at the second portion 975 of the gas channel 945. In some embodiments, the first wall 970 is made out of a material (e.g., quartz, aluminum, or aluminum oxide) that has a high sticking coefficient, causing the particles to accumulate on the surface 980 of the wall 970. In some embodiments, the angle $\Phi_{9a}$ is between approximately 45-135 degrees. In some embodiments, the first wall 970 includes a depression (e.g., the depression 735 from FIG. 7).

In some embodiments, the obstruction 987 includes a depression (e.g., the depression 735 from FIG. 7). The obstruction 987 can include a cooling member in thermal communication with the surface 980 of the first wall 970 of the obstruction 987. In some embodiments, the cooling member includes a coolant channel to receive a fluid to cool the surface 980 of the first wall 970 of the obstruction 987. In some embodiments, the particle trap includes a plurality of obstructions 987.

Still referring to FIG. 9, the gas channel 945 has a third portion 985. Particles in the gas directed from the second portion 975 of the gas channel 945 strike a second surface 992 of a second wall 990 at a second angle $\Phi_{9b}$ (e.g., in this embodiment, approximately 135 degrees) relative to the second surface 992 of the second wall 990. The momentum of the particles traveling along the second portion 975 of the gas channel 945 causes the particles to strike the second surface 992 of the second wall 990 when the path changes direction at the third portion 985 of the gas channel 945. In this embodiment, a portion of the second surface 992 of the second wall 990 defines a curve. In some embodiments, the wall 990 is made out of a material (e.g., quartz, aluminum, or aluminum oxide) that has a high sticking coefficient, causing the particles to accumulate on the wall 990. In some embodiments, the second angle $\Phi_{9b}$ is between approximately 45-135 degrees. In some embodiments, the second wall 990 includes a depression.

In this embodiment, the third portion 985 includes a depression in a third wall 920. Particles traveling along the third portion 985 enter a depression 935 of the third wall 920. The particles strike a surface 930 of the third wall 920. The depression 935 traps particles in the gas that are flowing along the third portion 985 of the gas channel 945, causing the particles to accumulate on the third surface 930 of the depression 935 and serves to prevent the particles from being dislodged by mechanical vibration in the system. In some embodiments, the third wall 920 is made out of a material (e.g., quartz, aluminum, or aluminum oxide) that has a high sticking coefficient, causing the particles to accumulate on the surface 930 of the third wall 920. In some embodiments, a cooling member is in thermal communication with the depression in the third wall 920.

After the activated gas is directed through the particle trap 940, the activated gas can be directed to the process chamber. Because particles accumulate on the surfaces 980, 992, and 930, the activated gas entering the process chamber has less particles than the activated gas entering the particle trap 940.

Figure 10:
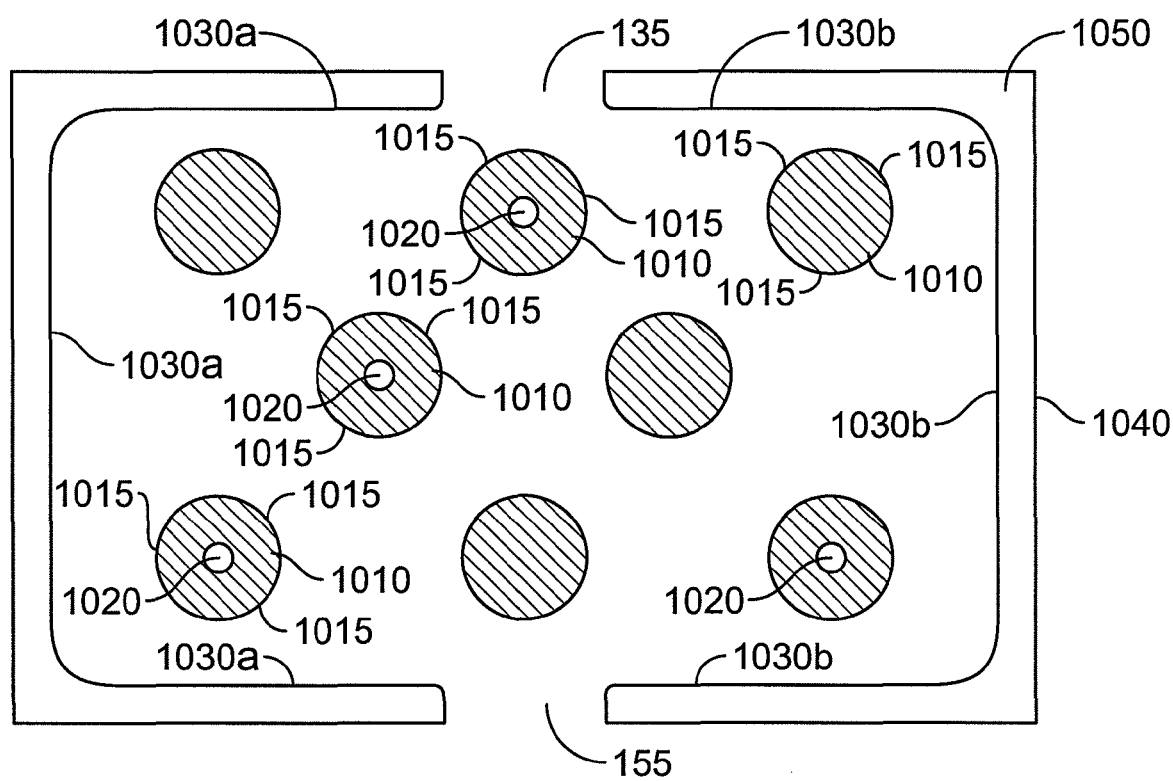
FIG. 10 is a schematic cross-sectional view of a particle trap, according to an illustrative embodiment of the invention.

FIG. 10 is a schematic cross-sectional view of a particle trap 1040, according to an illustrative embodiment of the invention. The particle trap 1040 can be used in a plasma generation system (e.g., the plasma generation system 100 of FIG. 1, 2, or 3). The particle trap 1040 includes a body structure 1050 having an inlet 135 that can be coupled to an outlet of a remote plasma source (e.g., the outlet 125 of the remote plasma source 110 of FIG. 1, 2, or 3). The body structure 1050 has an outlet 155 that can be coupled to the inlet of a process chamber (e.g., the inlet 160 of the process chamber 130 of FIG. 1, 2, or 3). The particle trap includes at least one obstruction 1010 in the body structure 1050. In some embodiments, the at least one obstruction 1010 is a plurality of obstructions 1010. In this embodiment, the particle trap 1040 includes 8 obstructions 1010. In some embodiments, the at least one obstruction 1010 has, or is, a wall (e.g., the wall 170 of FIG. 1 or 2) that is interior to exterior walls 1030a and 1030b of the body structure 1050. The at least one obstruction 1010 is configured to deflect a gas flowing from the inlet 135 to the outlet 155 to cause particles in the gas to strike a surface 1015 of the at least one obstruction 1010. The momentum of the particles flowing from the inlet 135 to the outlet 155 of the body structure 1050 causes the particles to strike the surface 1015 of the at least one obstruction 1010 when the gas is deflected thereby. In some embodiments, the surface 1015 of the at least one obstruction 1010 is made out of a material (e.g., quartz, aluminum, or aluminum oxide) that has a high sticking coefficient, causing the particles to accumulate on the surface 1015 of the at least one obstruction 1010. In some embodiments, the at least one obstruction 1010 includes a depression (e.g., the depression 935 of FIG. 9).

The at least one obstruction 1010 includes a cooling member 1020 in thermal communication with the surface 1015 of the at least one obstruction 1010. The cooling member 1020 can include a coolant channel to receive a fluid to cool the surface 1015 of the at least one obstruction 1010. The surface 1015 of the at least one member 1010 can be cooled to approximately 25-30° C. The particles entering the particle trap 1040 are thermally activated from processing in the remote plasma source. In some embodiments, the gas entering the particle trap 1040 is approximately 2000° C. The difference in temperature between the thermally-activated particles and the surface 1015 of the at least one member 1010 results in a local temperature gradient. The magnitude of a typical temperature gradient is greater than approximately 1000° C./cm. Gas species that absorb more plasma power (e.g., oxygen, nitrogen, hydrogen) will have larger temperature gradients than those that absorb less plasma power (e.g., argon). The local temperature gradient imparts a force to the thermally-activated particles, called the thermophoretic force, that acts in the direction of steepest temperature descent. The low temperature of the surface 1015 of the at least one member 1010 creates the temperature gradient in the gas, so the thermophoretic force acts to push particles toward the cold surface 1015 of the at least one member 1010.

Figure 11:
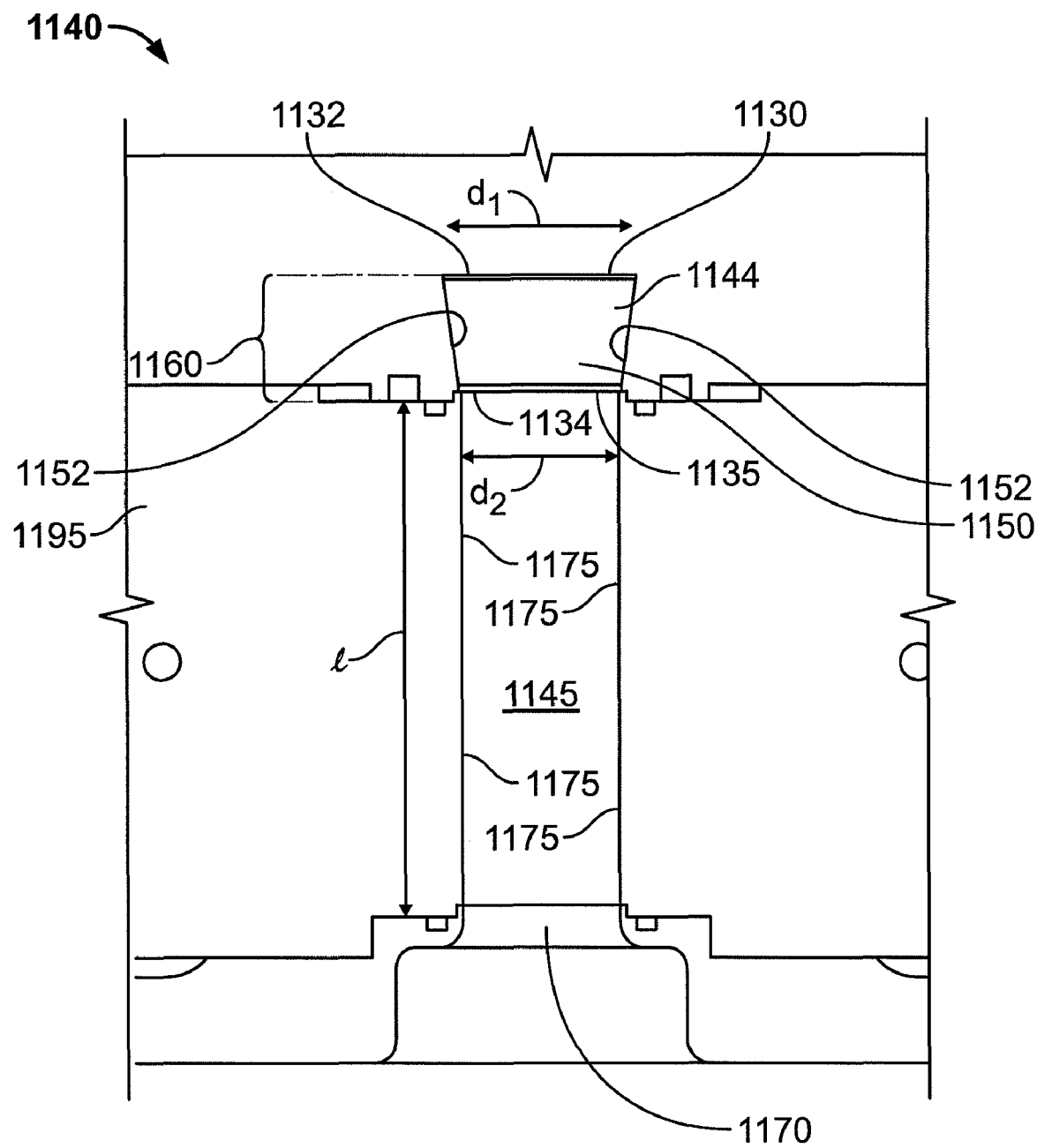
FIG. 11 is a schematic cross-sectional view of a particle trap, according to an illustrative embodiment of the invention.

FIG. 11 is a schematic cross-sectional view of a particle trap 1140, according to an illustrative embodiment of the invention. In this embodiment, a body structure 1150 of the particle trap 1140 is disposed in an outlet 1160 of a remote plasma source (e.g., the remote plasma source 120 of FIG. 1, 2, or 3). The body structure 1150 includes a first end 1130 and a second end 1135. The body structure 1150 has a channel 1144 with an inlet 1132 at the first end 1130 and an outlet 1134 at the second end 1135. Gas entering the inlet 1132 flows through the channel 1144 to the outlet 1134. In this embodiment, the body structure 1150 is substantially circular in cross section. A diameter $d_1$ of the inlet 1132 at the first end 1130 is greater than a diameter $d_2$ of the outlet 1134 at the second end 1135. Particles traveling through the channel 1144 of the body structure 1150 strike an interior surface 1152 of the second end 1135 at an angle relative to the interior surface 1152 of the second end 1135.

In some embodiments, the diameter $d_1$ of the first end 1130 is approximately equal to the diameter $d_2$ of the second end 1135. In some embodiments, the diameter $d_1$ is approximately 4.6 centimeters (1.8 inches) and the diameter $d_2$ is approximately 3.8 centimeters (1.5 inches). In some embodiments, the body structure 1150 is made out of a material (e.g., quartz, aluminum, or aluminum oxide) that has a high sticking coefficient, causing the particles to accumulate on the interior surface of the body structure 1150.

The body structure is coupled to a conduit 1145. The conduit 1145 is coupled to an inlet 1170 of a process chamber (e.g., the process chamber 130 of FIG. 1, 2, or 3). The conduit 1145 transports gas from the outlet 1134 of the body structure 1150 to the inlet 1170 of the process chamber. In this embodiment, the conduit 1145 is substantially cylindrical. In some embodiments, a length l of the conduit 1145 is approximately 10.2 centimeters (4 inches). The particle trap 1140 also includes a cooling member 1195. The cooling member 1195 is in thermal communication with the conduit 1145 and the body structure 1150. The cooling member 1195 cools an interior surface 1175 of the conduit 1145. In some embodiments, the cooling member 1195 includes one or more coolant channels that are in the body of the cooling member 1195 through which coolant flows. In some embodiments, the interior surface 1175 of the conduit 1145 is cooled to approximately 25-30° C. The particles entering the conduit 1145 are thermally activated from processing in a remote plasma source. In some embodiments, the gas entering the conduit 1145 is approximately 2000° C. The difference in temperature between the thermally-activated particles and the interior surface 1175 of the conduit 1145 results in a local temperature gradient. The magnitude of a typical temperature gradient is greater than approximately 1000° C./cm. Gas species that absorb more plasma power (e.g., oxygen, nitrogen, hydrogen) will have larger temperature gradients than those that absorb less plasma power (e.g., argon). The local temperature gradient imparts a force to the thermally-activated particles, called the thermophoretic force, that acts in the direction of steepest temperature descent. The low temperature of the interior surface 1175 of the conduit 1145 creates the temperature gradient in the gas, so the thermophoretic force acts to push particles towards the colder interior surface 1175 of the conduit 1145.

After the activated gas is directed through the particle trap 1140, the activated gas can be directed to a process chamber. Because particles accumulate on the interior surfaces of the body structure 1150 and the conduit 1145, the activated gas entering the process chamber has less particles than the activated gas entering the particle trap 1140.

Figure 12:
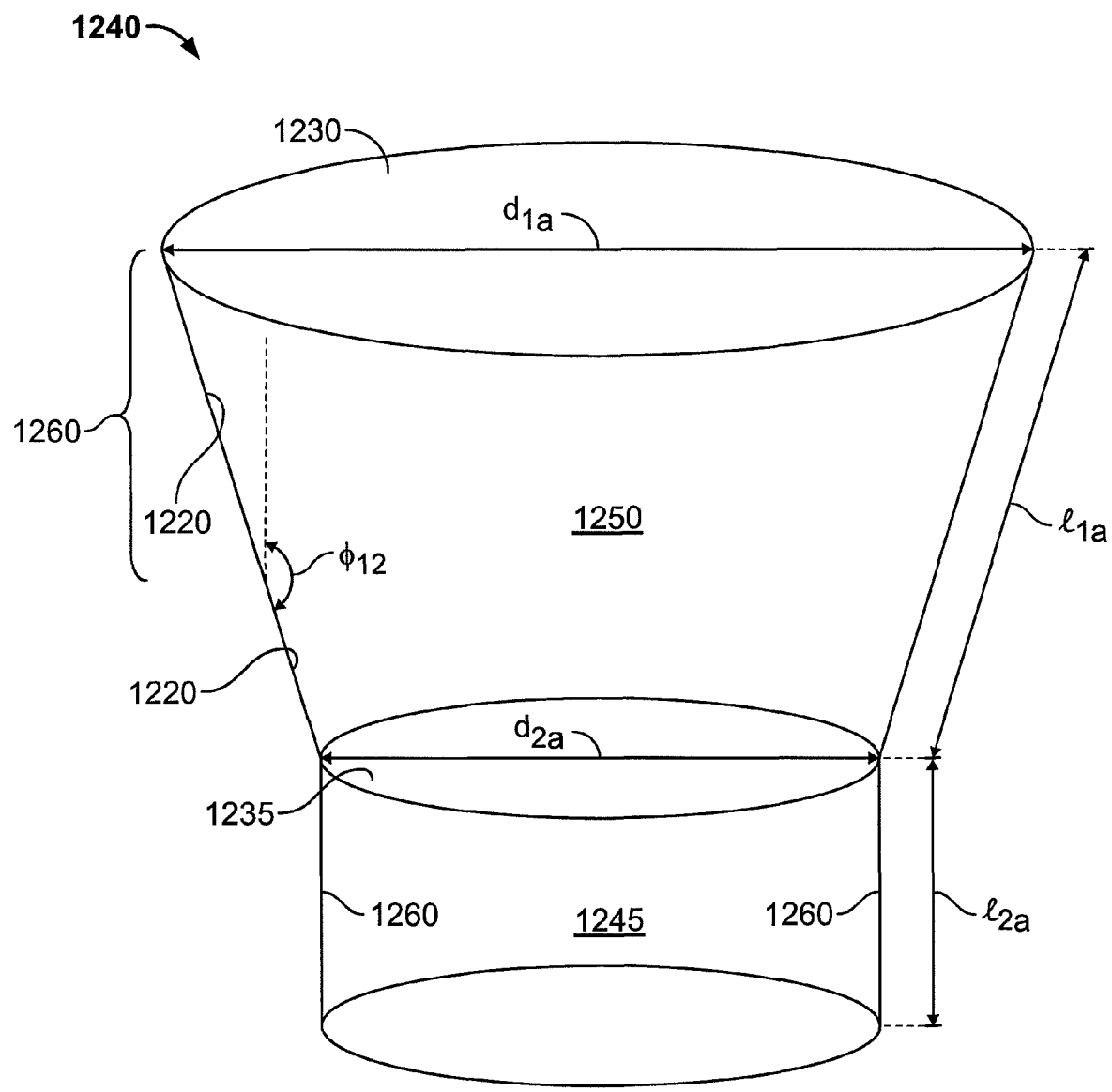
FIG. 12 is a schematic cross-sectional view of a particle trap, according to an illustrative embodiment of the invention.

FIG. 12 is a schematic cross-sectional three-dimensional view of a particle trap 1240, according to an illustrative embodiment of the invention. In this embodiment, a body structure 1250 of the particle trap 1240 is an outlet 1260 of a remote plasma source (e.g., the remote plasma source 120 of FIG. 1, 2, or 3). The body structure 1250 has a length $l_{1a}$ and includes a first end 1230 and a second end 1235. A diameter $d_{1a}$ of the first end 1230 is greater than a diameter $d_{2a}$ of the second end 1235. Particles traveling through the body structure 1250 strike an interior surface 1220 of the second end 1235 at an angle $\Phi_{12}$ relative to the interior surface 1220 of the second end 1235.

In some embodiments, the body structure 1250 is made out of a material (e.g., quartz, aluminum, or aluminum oxide) that has a high sticking coefficient, causing the particles to accumulate on the interior surface 1220 of the body structure 1250.

In some embodiments, the diameter $d_{1a}$ of the first end 1230 is approximately equal to the diameter $d_{2a}$ of the second end 1235. The effectiveness (e.g., number of particles trapped) of the particle trap 1240 increases as a ratio of the diameter $d_{1a}$ to the diameter $d_{2a}$ increases (i.e., the angle $\Phi_{12}$ increases). In some embodiments, the diameter $d_{1a}$ is approximately 4.6 centimeters (1.8 inches), the diameter $d_{2a}$ is approximately 3.8 centimeters (1.5 inches), and the length $l_{1a}$ is approximately 2.8 centimeters (1.1 inches). In some embodiments, the body structure 1250 is in thermal communication with a cooling member.

In some embodiments, the second end 1235 of the body structure 1250 is coupled to an inlet of a process chamber (e.g., the process chamber 130 of FIG. 1, 2, or 3). In this embodiment, the second end 1235 of the body structure 1250 is coupled to a conduit 1245. The conduit 1245 is substantially cylindrical. The conduit 1245 is coupled to an inlet of the process chamber (e.g., the process chamber 130 of FIG. 1, 2, or 3). In some embodiments, the conduit 1245 is made out of a material (e.g., quartz, aluminum, or aluminum oxide) that has a high sticking coefficient, causing particles to accumulate on an interior surface 1260 of the conduit 1245. The effectiveness (e.g., number of particles trapped) of the conduit 1245 increases as a length $l_{2a}$ increases.

In some embodiments, the conduit 1245 is in thermal communication with a cooling member (not shown). The interior surface 1260 of the conduit 1245 can be cooled by the cooling member. The particles entering the conduit 1245 are thermally activated from processing in the remote plasma source. The difference in temperature between the thermally-activated particles and the interior surface 1260 of the conduit 1245 results in a local temperature gradient in the gas. The magnitude of a typical temperature gradient is greater than approximately 1000° C./cm. Gas species that absorb more plasma power (e.g., oxygen, nitrogen, hydrogen) will have larger temperature gradients than those that absorb less plasma power (e.g., argon). The local temperature gradient imparts a force to the thermally-activated particles, called the thermophoretic force, that acts in the direction of steepest temperature descent. The low temperature of the interior surface 1260 of the conduit 1245 creates the temperature gradient in the gas, so the thermophoretic force acts to push particles toward the colder interior surface 1260 of the conduit 1245. In some embodiments, the length $l_{2a}$ is approximately 10.2 centimeters (4 inches). In some embodiments, the conduit 1245 is coupled to a subsequent particle trap.

After the activated gas is directed through the particle trap 1240 and the conduit 1245, the activated gas can be directed to the process chamber. Because particles accumulate on the interior surface 1220 of the body structure 1250 and the interior surface 1260 of the conduit 1245, the activated gas entering the process chamber has less particles than the activated gas entering the particle trap 1240 and the member 1245.

Variations, modifications, and other implementations of what is described herein will occur to those of ordinary skill in the art without departing from the spirit and the scope of the invention and are considered to be encompassed thereby.

Accordingly, the invention is not to be defined only by the preceding illustrative description.

The invention claimed is:

1. A particle trap for a remote plasma source, comprising:
   a body structure having an inlet for coupling to a chamber of a remote plasma source and an outlet for coupling to a process chamber inlet; and
   a gas channel formed in the body structure and in fluid communication with the body structure inlet and the body structure outlet, the gas channel defining a path through the body structure that causes particles in a gas passing from a first portion of the gas channel to strike a wall that defines a second portion of the gas channel at an angle relative to a surface of the wall, wherein the wall that defines the second portion of the gas channel comprises a material that has a high sticking coefficient, causing particles in the gas to accumulate on the second portion.

2. The particle trap of claim 1, wherein the angle is between approximately 45-135 degrees.

3. The particle trap of claim 2, wherein the first portion of the channel is at a substantially normal angle to the second portion of the channel.

4. The particle trap of claim 1, wherein the gas channel has a third portion and particles in the gas passing from the second portion strike a second wall that defines the third portion at a second angle relative to a second surface of the second wall.

5. The particle trap of claim 4, wherein the second angle is between approximately 45-135 degrees.

6. The particle trap of claim 1, wherein at least the first section and the second section define a curve.

7. The particle trap of claim 1, wherein the surface of the wall is at least one of irregular or textured.

8. The particle trap of claim 1, wherein the body structure is disposed in the remote plasma source.

9. The particle trap of claim 1, wherein a pressure drop between the body structure inlet and the body structure outlet is less than approximately 100 milliTor.

10. The particle trap of claim 1, further comprising a depression in the wall of at least one of the first portion or the second portion of the gas channel, the depression adapted to collect the particles in the gas.

11. The particle trap of claim 1, further comprising a cooling member in thermal communication with the gas channel.

12. The particle trap of claim 11, wherein the cooling member comprises at least one coolant channel formed in the body structure to receive a fluid to cool at least a portion of the wall of the second portion of the gas channel.

13. The particle trap of claim 11, wherein the cooling member comprises a cooling plate.

14. The particle trap of claim 11, wherein the cooling member indirectly cools at least a portion of the wall of the second portion of the gas channel.

15. The particle trap of claim 11, wherein the cooling member is disposed in the body structure.

16. The particle trap of claim 12, wherein a path of the at least one coolant channel is at least substantially parallel to the path of the gas channel.

17. The particle trap of claim 1, wherein the wall is a portion of an obstruction that is interior to exterior walls of the body structure.

18. The particle trap of claim 17, wherein the obstruction comprises a cooling member in thermal communication with the surface of the wall of the obstruction.

19. The particle trap of claim 18, wherein the cooling member comprises a coolant channel to receive a fluid to cool the surface of the wall of the obstruction.

20. The particle trap of claim 17, further comprising a plurality of obstructions.

21. A particle trap for a remote plasma source, comprising:
    a body structure having an inlet for coupling to a chamber of a remote plasma source and an outlet for coupling to a process chamber inlet;
    a gas channel formed in the body structure and in fluid communication with the body structure inlet and the body structure outlet, the gas channel defining a path through the body structure; and
    a cooling member in thermal communication with the gas channel that cools at least a portion of the gas channel, resulting in a local temperature gradient in a gas passing through the gas channel that causes particles of the gas to accumulate on the portion of the gas channel.

22. The particle trap of claim 21, wherein the cooling member comprises at least one coolant channel formed in the body structure to receive a fluid to cool at least a portion of a wall of the gas channel.

23. The particle trap of claim 21, wherein the cooling member comprises a cooling plate.

24. The particle trap of claim 21, wherein the cooling member indirectly cools at least a portion of a wall of the gas channel.

25. The particle trap of claim 21, wherein the cooling member is disposed in the body structure.

26. The particle trap of claim 21, wherein the path through the body structure causes particles in a gas passing from a first portion of the channel to strike a wall that defines a second portion of the gas channel at an angle relative to a surface of the wall.

27. The particle trap of claim 26, wherein the gas channel has a third portion and particles in the gas passing from the second portion strike a second wall that defines the third portion at a second angle relative to a second surface of the second wall.

28. The particle trap of claim 21, wherein the body structure is disposed in the remote plasma source.

29. The particle trap of claim 26, further comprising a depression in the wall of at least one of the first portion or the second portion of the gas channel, the depression adapted to collect the particles in the gas.

30. A method for removing particles from a gas output by a plasma source, comprising:
    receiving at an inlet an activated gas generated by a plasma in a chamber;
    directing the activated gas through a gas channel formed in a body structure configured to cause particles in the activated gas passing from a first portion of the gas channel to strike a wall that defines a second portion of the gas channel at an angle relative to a surface of the wall, wherein the wall that defines the second portion of the gas channel comprises a material that has a high sticking coefficient, causing particles in the gas to accumulate on the second portion; and
    directing the activated gas exiting the gas channel to a process chamber.

31. The method of claim 30, further comprising cooling at least a portion of the wall to cause particles in the activated gas to accumulate on the wall.

32. The method of claim 30, further comprising directing the activated gas through the gas channel of the body structure from the second portion of the channel to strike a second wall that defines a third portion of the channel at a second angle relative to a second surface of the second wall.

33. The method of claim 32, further comprising cooling at least a portion of the second wall to cause the particles in the activated gas to accumulate on the second wall.

34. The method of claim 31, further comprising flowing a fluid in a coolant channel in the body structure to cool at least a portion of the wall.

35. The method of claim 31, wherein the wall is indirectly cooled.

36. The method of claim 31, further comprising regulating a temperature of the wall.

37. The method of claim 30, further comprising monitoring a particle count of the activated gas with an electronic device.

38. The method of claim 37, further comprising generating a signal when the particle count exceeds a predetermined limit.

39. The method of claim 30, wherein the gas channel causes a pressure drop between an inlet of the body structure and an outlet of the body structure less than approximately 100 milliTor.

40. A method for removing particles from a gas output by a plasma source, comprising:
receiving at an inlet an activated gas generated by a plasma in a chamber;
directing the activated gas through a gas channel formed in a body structure;
cooling at least a portion of a wall of the gas channel, resulting in a local temperature gradient in the activated gas that causes particles in the activated gas to accumulate on the wall; and
directing the activated gas exiting the gas channel to a process chamber.

41. The method of claim 40, wherein at least a portion of the wall is indirectly cooled.

42. The method of claim 40, further comprising regulating a temperature of the wall.

43. The method of claim 40, further comprising directing the activated gas through the gas channel of the body structure from a first portion of the channel to strike a second wall that defines a second portion of the channel at an angle relative to a surface of the wall.

44. The method of claim 43, further comprising cooling at least a portion of the second wall to cause the particles in the activated gas to accumulate on the second wall.

45. The method of claim 40, further comprising flowing a fluid in a coolant channel in the body structure to cool at least a portion of the wall.

46. A system comprising:
a remote plasma source;
a body structure having an inlet for coupling to a chamber of the remote plasma source and an outlet for coupling to an inlet of a process chamber; and
a gas channel formed in the body structure and in fluid communication with the body structure inlet and the body structure outlet, the gas channel defining a path through the body structure that causes particles in a gas passing from a first portion of the channel to strike a wall that defines a second portion of the gas channel at an angle relative to a surface of the wall, wherein the wall that defines the second portion of the gas channel comprises a material that has a sticking coefficient sufficient to cause particles in the gas to accumulate on the second portion.

47. A system comprising:
a remote plasma source;
a body structure having an inlet for coupling to a chamber of a remote plasma source and an outlet for coupling to a plasma chamber inlet;
a gas channel formed in the body structure and in fluid communication with the body structure inlet and the body structure outlet; and
a cooling member in thermal communication with the gas channel that cools at least a portion of the gas channel, resulting in a local temperature gradient in a gas passing through the gas channel that causes particles of the gas to accumulate on the portion of the gas channel.

48. A method of manufacturing a particle trap, the method comprising:
creating a gas channel in a body structure, the gas channel having an inlet capable of coupling to a chamber of a remote plasma source and an outlet capable of coupling to an inlet of a process chamber, the gas channel being configured to cause particles in a gas passing from a first portion of the channel to strike a wall that defines a second portion of the gas channel at an angle relative to a surface of the wall, wherein the wall that defines the second portion of the gas channel comprises a material that has a high sticking coefficient, causing particles in the gas to accumulate on the second portion.

49. The method of claim 48, further comprising thermally coupling a cooling member to the gas channel.

50. The method of claim 49, further comprising forming at least one coolant channel in the body structure to receive a fluid to cool at least a portion of the wall of the second portion of the gas channel.

51. A particle trap for a remote plasma source, comprising:
a means for receiving at an inlet an activated gas generated by a plasma in a chamber;
a means for directing the activated gas through a gas channel formed in a body structure configured to cause particles in the activated gas passing from a first portion of the gas channel to strike a wall that defines a second portion of the gas channel at an angle relative to a surface of the wall; and
a means for cooling at least a portion of the wall, resulting in a local temperature gradient in the activated gas that causes particles in the activated gas to accumulate on the wall.

52. A particle trap for a remote plasma source, comprising:
a body structure having an inlet for coupling to a chamber of a remote plasma source and an outlet for coupling to a process chamber inlet; and
at least one obstruction in the body structure configured to deflect a gas flowing from the inlet to the outlet to cause particles in the gas to strike a surface of the obstruction, wherein the obstruction comprises a material that has a high sticking coefficient, causing particles in the gas to accumulate on the obstruction.

53. The particle trap of claim 52, wherein the at least one obstruction comprises a cooling member in thermal communication with the surface of the at least one obstruction.

54. The particle trap of claim 53, wherein the cooling member comprises a coolant channel to receive a fluid to cool the surface of the at least one obstruction.

55. The particle trap of claim 52, wherein the at least one obstruction is a plurality of obstructions.

56. The particle trap of claim 52, wherein the at least one obstruction is a wall that is interior to exterior walls of the body structure.

* * * * *